US012581661B2

(12) United States Patent
Hwang et al.

(10) Patent No.: US 12,581,661 B2
(45) Date of Patent: Mar. 17, 2026

(54) CROSSBAR ARRAY DEVICE APPLICABLE TO GRAPH DATA ANALYSIS, NUEROMORPHIC DEVICE INCLUDING THE SAME, OPERATION METHOD OF CROSSBAR ARRAY DEVICE AND GRAPH DATA ANALYSIS METHOD USING CROSSBAR ARRAY DEVICE

(71) Applicant: Seoul National University R&DB foundation, Seoul (KR)

(72) Inventors: Cheol Seong Hwang, Seoul (KR); Yoon Ho Jang, Seoul (KR); Jang Uk Han, Gyeonggi-do (KR)

(73) Assignee: Seoul National University R&DB foundation, Seoul (KR)

( * ) Notice: Subject to any disclaimer, the term of this patent is extended or adjusted under 35 U.S.C. 154(b) by 201 days.

(21) Appl. No.: 18/593,370

(22) Filed: Mar. 1, 2024

(65) Prior Publication Data

US 2024/0298453 A1 Sep. 5, 2024

(30) Foreign Application Priority Data

Mar. 3, 2023 (KR) ........................ 10-2023-0028190

(51) Int. Cl.
*G11C 13/00* (2006.01)
*H10B 63/00* (2023.01)
(52) U.S. Cl.
CPC ......... *H10B 63/84* (2023.02); *G11C 13/0026* (2013.01); *G11C 13/0028* (2013.01)

(58) Field of Classification Search
CPC ............ G11C 13/0026; G11C 13/0028; G11C 13/0007; G11C 13/004; H10B 63/84
See application file for complete search history.

(56) References Cited

U.S. PATENT DOCUMENTS

| | | | | |
|---|---|---|---|---|
| 7,623,370 | B2 * | 11/2009 | Toda ..................... | G11C 13/004 |
| | | | | 365/163 |
| 8,243,493 | B2 * | 8/2012 | Toda ...................... | G11C 13/00 |
| | | | | 365/158 |
| 9,324,942 | B1 * | 4/2016 | Nazarian .............. | H10N 70/884 |
| 11,681,903 | B2 | 6/2023 | Vasanthakumaribabu et al. | |
| 2009/0003047 | A1 * | 1/2009 | Toda ................... | G11C 13/004 |
| | | | | 365/163 |
| 2023/0335190 | A1 * | 10/2023 | Ge ...................... | G11C 13/0023 |
| 2023/0419092 | A1 * | 12/2023 | Mackin ................... | G06N 3/09 |

FOREIGN PATENT DOCUMENTS

| | | |
|---|---|---|
| KR | 10-2114356 | 5/2020 |
| KR | 10-2514931 | 3/2023 |

* cited by examiner

*Primary Examiner* — Khamdan N. Alrobaie

(57) ABSTRACT

Disclosed is a crossbar array device applicable to graph data analysis including a plurality of word lines extending in a first direction; a plurality of bit lines extending in a second direction intersecting the plurality of word lines; a plurality of conductor cells disposed in intersection regions corresponding to a diagonal among a plurality of intersection regions defined between the plurality of word lines and the plurality of bit lines; and a plurality of rectifying resistance change cells disposed in remaining intersection regions excluding the diagonal among the plurality of intersection regions, having a rectifying characteristic and storing a changeable resistance state.

19 Claims, 34 Drawing Sheets

< Comparative Embodiment >

< Comparative Embodiment >

< Comparative Embodiment >

< Comparative Embodiment >

< Comparative Embodiment >

Single ground method (SGM)

Multi ground method (MGM)

ADHD

Neurotypical controls

CROSSBAR ARRAY DEVICE APPLICABLE TO GRAPH DATA ANALYSIS, NUEROMORPHIC DEVICE INCLUDING THE SAME, OPERATION METHOD OF CROSSBAR ARRAY DEVICE AND GRAPH DATA ANALYSIS METHOD USING CROSSBAR ARRAY DEVICE

CROSS-REFERENCE TO RELATED APPLICATION

This application claims priority of Korean Patent Application No. 10-2023-0028190, filed on Mar. 3, 2023, in the KIPO (Korean Intellectual Property Office), the disclosure of which is incorporated herein entirely by reference.

BACKGROUND OF THE INVENTION

Field of the Invention

The present invention relates to an electronic device, its operation methods and its applications, and more particularly, to a crossbar array device, a neuromorphic devices/system including the same, and an operation method and application of the crossbar array device.

Description of the Related Art

A crossbar array (CBA) may be utilized as a high-density non-volatile memory or a storage. Furthermore, the crossbar array has great potential in implementing a hardware of various neuromorphic networks as a synaptic weight-representing device or temporal/physical kernel. However, in both applications, passive configuration of the crossbar array may cause serious problems due to leakage current (i.e., sneak current). Sneak current may flow in multiple parallel paths where minimum resistance is formed. The vector-matrix multiplication method may be applied to calculations using an existing crossbar array, and in this case, a problem occurs in which accuracy of calculations decreases because of sneak current, current-voltage nonlinearity (I-V nonlinearity), and measurement variation, and the like.

Meanwhile, graph data may have a data structure which models a set of nodes connected by edges. A variety of critical problems may be intuitively expressed in a graph form. Therefore, the graph data is receiving great attention in contemporary computing fields such as understanding of social networks, molecular structures, virus transmission networks, device designing, and the World Wide Web. Furthermore, the graph data is also used in social sciences and biology.

However, unlike general data, the graph data structure has a relatively complex form consisting of two objects (nodes) and a line (an edge) that explains the relationship thereof. Analysis is difficult when using the existing data processing methods, and losses may also occur during processing. For this reason, when analyzing the graph data and solving related problems, the existing computational algorithms may have various limitations and disadvantages. For example, since the existing calculation algorithms may require an excessive number of calculations for analysis, they consume a lot of time and power, and the accuracy/reliability of calculations may also be relatively low. In addition, since a graph data of a non-Euclidean type may be applied to existing calculation algorithms only after conversion (i.e. preprocessing) to a graph data of Euclidean type, loss of information during the data conversion process occurs. There is a problem that costs and time required increase.

Therefore, there is a need for the development of new hardware and related methods which may perform analysis on various graph data with low power consumption, high speed, and high accuracy/reliability. In addition, development of hardware and related methods which may provide analysis solutions to graphic problems without pre-processing non-Euclidean type graph data is required.

The above-described information disclosed in the background description is provided only for improving the understanding of the background of the present disclosure, and thus may include the information which does not constitute the prior art.

SUMMARY OF THE INVENTION

The technological object to be achieved by the present invention is to provide a crossbar array device which may perform analysis on various graph data with low power consumption, high speed, and high accuracy/reliability.

In addition, the technological object to be achieved by the present invention is to provide a crossbar array device which may provide an analysis solution to graphic problems without preprocessing non-Euclidean type graph data.

In addition, the technological object to be achieved by the present invention is to provide a neuromorphic device (neuromorphic system) including the crossbar array device.

Furthermore, the technological object to be achieved by the present invention is to provide an operation method of the crossbar array device.

In addition, the technological object to be achieved by the present invention is to provide a graph data analysis method using the crossbar array device.

The objects to be achieved by the present invention is not limited to the objects mentioned above, and other objects not mentioned will be understood by those skilled in the art from the description below.

According to an embodiment of the present invention, there is provided a crossbar array device applicable to graph data analysis comprising: a plurality of word lines extending in a first direction; a plurality of bit lines extending in a second direction intersecting the plurality of word lines; a plurality of conductor cells disposed in the intersection regions corresponding to a diagonal among a plurality of intersection regions defined between the plurality of word lines and the plurality of bit lines; and a plurality of rectifying resistance change cells disposed in remaining intersection regions excluding the diagonal among the plurality of intersection regions, and having a rectifying characteristic and storing a changeable resistance state.

The plurality of conductor cells may be disposed in intersection regions corresponding to the main diagonal in the plurality of intersection regions.

The plurality of conductor cells may be metal cells.

The plurality of rectifying resistance change cells may be self-rectifying memristors.

The plurality of rectifying resistance change cells may be configured to be programmed according to graph data to be analyzed.

Graph data to be analyzed by the crossbar array device may include a plurality of nodes and a plurality of edges connecting the plurality of nodes, and information corresponding to the plurality of nodes may be mapped to the plurality of conductor cells, and information corresponding to the plurality of edges may be mapped to the plurality of rectifying resistance change cells.

A number of the plurality of word lines and a number of the plurality of bit lines may be the same.

According to another embodiment of the present invention, a neuromorphic device including the above-described crossbar array device is provided.

According to another embodiment of the present invention, there is provided a graph data analysis method using a crossbar array device comprising: preparing a crossbar array device comprising a plurality of word lines extending in a first direction, a plurality of bit lines extending in a second direction intersecting the plurality of word lines, a plurality of conductor cells disposed in intersection regions corresponding to a diagonal among a plurality of intersection regions defined between the plurality of word lines and the plurality of bit lines and a plurality of rectifying resistance change cells disposed in remaining intersection regions excluding the diagonal among the plurality of intersection regions, and having a rectifying characteristic and storing a changeable resistance state; mapping graph data to be analyzed to the crossbar array device; and performing measurement on the crossbar array device to which the graph data is mapped.

The plurality of conductor cells may be disposed in intersection regions corresponding to the main diagonal in the plurality of intersection regions.

The plurality of rectifying resistance change cells may be self-rectifying memristors.

The graph data may include a plurality of nodes and a plurality of edges connecting the plurality of nodes, and in the mapping graph data, information corresponding to the plurality of nodes may be mapped to the plurality of conductor cells, and information corresponding to the plurality of edges may be mapped to the plurality of rectifying resistance change cells.

The performing measurement on the crossbar array device may include performing a single ground method (SGM) measurement applying a read signal to one word line selected from among the plurality of word lines and applying a ground signal to one bit line selected from the plurality of bit lines.

The performing measurement on the crossbar array device may include performing a multi-ground method (MGM) measurement applying a read signal to one word line connected to a conductor cell selected from the plurality of conductor cells among the plurality of word lines, and applying a ground signal to at least two of remaining bit lines excluding a bit line connected to the selected conductor cell among the plurality of bit lines.

The graph data analysis method may include performing a pathfinding algorithm.

In the performing the pathfinding algorithm, performing a multi-ground method (MGM) measurement and performing a single-ground method (SGM) measurement may be alternately repeated. The performing the multi-ground method (MGM) measurement may be configured to apply a read signal to one word line connected to a conductor cell selected from the plurality of conductor cells among the plurality of word lines and to apply a ground signal to at least two of remaining bit lines excluding a bit line connected to the selected conductor cell from the plurality of bit lines. The performing the single ground method (SGM) measurement may be configured to apply a read signal to one word line selected from among the plurality of word lines and to apply a ground signal to one bit line selected from the plurality of bit lines.

The graph data analysis method may include performing a link prediction algorithm.

The performing the link prediction algorithm may include performing a multi-ground method (MGM) measurement for a first conductor cell selected from among the plurality of conductor cells; performing a multi-ground method (MGM) measurement for a second conductor cell selected from among the plurality of conductor cells; and performing a single ground method (SGM) measurement on the first selected conductor cell and the second selected conductor cell. The performing the multi-ground method (MGM) measurement may be configured to apply a read signal to one word line connected to a conductor cell selected from the plurality of conductor cells among the plurality of word lines, and to apply a ground signal to at least two of remaining bit lines excluding a bit line connected to the selected conductor cell among the plurality of bit lines. The performing the single ground method (SGM) measurement may be configured to apply a read signal to one word line selected among the plurality of word lines and to apply a ground signal to one bit line selected among the plurality of bit lines.

The graph data analysis method may include performing a community detection algorithm.

The performing the community detection algorithm may include performing a single ground measurement (SGM) measurement for each of combinations of two conductor cells selected from the plurality of conductor cells; and evaluating modularity of a plurality of nodes corresponding to the plurality of conductor cells. The performing the single ground method (SGM) measurement may be configured to apply a read signal to one word line selected among the plurality of word lines and to apply a ground signal to one bit line selected among the plurality of bit lines.

The graph data may be data including brain network information, and the graph data analysis method may be configured to analyze a feature related to brain activity.

The graph data may be a non-Euclidean type graph data.

According to embodiments of the present invention, a crossbar array device which may perform analysis on various graph data with low power consumption, high speed, and high accuracy/reliability, and an operation method thereof may be implemented. In addition, according to embodiments of the present invention, a crossbar array device which may provide an analysis solution to graphic problems without preprocessing non-Euclidean type graph data, and an operation method thereof may be implemented. According to embodiments of the present invention, a graph data analysis method using the above-described crossbar array device may be provided. The crossbar array device described above may be usefully used in a neuromorphic device (neuromorphic system) and neural networks.

Most graph data belongs to a non-Euclidean space where location information is not given to nodes, and in order to process non-Euclidean graph data, complex preprocessing processes such as graph embedding, which projects graph data into Euclidean space, are required. The new crossbar array device proposed in an embodiment of the present invention may store non-Euclidean type graph data and simultaneously analyze it without a separate preprocessing process. Saving and analyzing a graph data as it is not only tremendously reduces computational costs, but also avoids problems such as data loss which occurs during preprocessing.

In addition, a graph data may change depending on the situation, and the existing method has a limitation that it is vulnerable to dynamic data processing because data preprocessing must be performed every time the data changes. However, the new crossbar array device proposed in the embodiment of the present invention has the advantage that it may be more advantageous in situations where a graph data changes and grows in a real time because it is able to freely change data, such as adding a new node or changing edge information.

However, the effects of the present invention are not limited to the above effects and may be expanded in various ways without departing from the technological spirit and scope of the present invention.

BRIEF DESCRIPTION OF THE DRAWINGS

The above and other features and advantages will become more apparent to those of ordinary skill in the art by describing in detail exemplary embodiments with reference to the attached drawings, in which:

FIG. 40 is a graph showing the results obtained by evaluating accuracy in ADHD classification when a learning process is performed based on SGM measured current values by applying a crossbar array device according to an embodiment of the present invention.

FIG. 41 is a graph showing the results obtained by evaluating accuracy and "Area Under Curve (AUC)" characteristics through learning of ADHD classification using an embodiment of the present invention and existing algorithms.

In the following description, the same or similar elements are labeled with the same or similar reference numbers.

DETAILED DESCRIPTION

Figure 1:
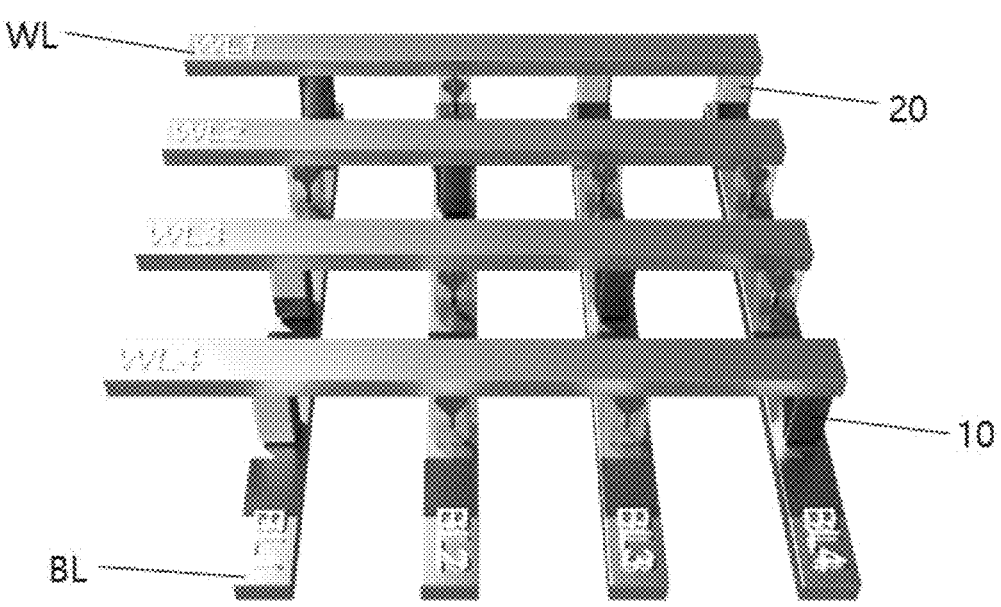
FIG. 1 is a perspective view showing a crossbar array device applicable to graph data analysis according to an embodiment of the present invention.

Hereinafter, a preferred embodiment of the present disclosure will be elucidated in detail with reference to the accompanying drawings.

The embodiments of the present disclosure are provided for more completely explaining the present disclosure to those skilled in the art, the below embodiments can be modified to various forms and the scope of the present disclosure is not limited to the below embodiments. These embodiments are rather provided for more faithfully and completely explaining the present disclosure and for completely conveying the spirit of the present disclosure to those skilled in the art.

In the drawings, in addition, the dimension or thickness of each layer is exaggerated for clarity and convenience of the description and the same reference numeral indicates the same structural element. As used in the detail description, the term "and/or" includes any one of the listed items and one or more combination thereof. In addition, the term "connect" in the detail description means the state in which A member is directly connected to B member as well as the state in which C member disposed between A member and B member so that A member is indirectly connected to B member via C member.

The terms used herein are employed for describing the specific embodiment and the present disclosure is not limited thereto. As used in the detailed description and the appended claims, the singular forms may include the plural forms as well, unless the context clearly indicates otherwise. In addition, the terms "comprises" and/or "comprising" or "includes" and/or "including" used in the detailed description specify the presence of stated features, regions, integers, steps, operations, elements, and/or components, but do not preclude the presence or addition of one or more other features, regions, integers, steps, operations, elements, components, and/or groups thereof.

Although the terms of "first", "second", etc. are used herein to describe various members, parts, regions, layers and/or sections, it is obvious that these members, parts, regions, layers and/or sections should not be limited by the above terms. These terms are employed only for distinguishing one member, part, region, layer or section from another region, layer or section. Thus, the first member, the first part, the first region, the first layer or the first section described below may refer to the second member, the second part, the second region, the second layer or section without departing from the teachings of the present disclosure.

Furthermore, the terms related to a space such as "beneath", "below", "lower", "above" and "upper" may be used to easily understand one element or a characteristic or another element or a characteristic illustrated in the drawings. The above terms related to the space are employed for easy understanding of the present disclosure depending on various process states or usage states of the present disclosure, and are not intended to limit the present disclosure.

FIG. 1 is a perspective view showing a crossbar array device applicable to graph data analysis according to an embodiment of the present invention.

Referring to FIG. 1, a crossbar array device applicable to graph data analysis according to an embodiment of the present invention may include a plurality of word lines WL extending in a first direction and a plurality of bit lines BL extending in a second direction intersecting the plurality of word lines WL. The second direction may be perpendicular to the first direction. Accordingly, the plurality of bit lines BL and the plurality of word lines WL may be orthogonal. The plurality of word lines WL may be arranged above the plurality of bit lines BL so that WL may be spaced apart from BL. Alternatively, the plurality of bit lines BL may be disposed above the word lines WL so that BL may be spaced apart from WL.

The crossbar array device may include a plurality of conductor cells 10 disposed in intersection regions corresponding to a diagonal (diagonal line) among a plurality of intersection regions defined between a plurality of word lines WL and a plurality of bit lines BL. The plurality of intersection regions may be arranged to form a single square shape, and the plurality of conductor cells 10 may be arranged in the intersection regions corresponding to a diagonal of the square shape. Accordingly, the plurality of word lines WL and the plurality of bit lines BL may be electrically shorted (i.e., conduct current) by the plurality of conductor cells 10 in the diagonal region. Furthermore, the crossbar array device may include a plurality of rectifying resistance change cells 20 disposed in intersection regions excluding the diagonal among the plurality of intersection regions. A plurality of rectifying resistance change cells 20 may have a rectifying characteristic and may have a characteristic to store (i.e., memory) a changeable resistance state.

The plurality of conductor cells 10 may be disposed in intersection regions corresponding to a main diagonal of the plurality of intersection regions. The plurality of intersection regions may be arranged to form a single quadrangle, and the plurality of conductor cells 10 may be arranged in the intersection regions corresponding to the diagonal dividing the quadrangle in half in a diagonal direction, that is, the main diagonal. According to one embodiment, the number of word lines WL and the number of bit lines BL may be the same. Accordingly, the quadrangle may be a square shape.

The plurality of conductor cells 10 may be metal cells. In other words, the plurality of conductor cells 10 may be made of metal. The lower surface of the conductor cell 10 may be in contact with or connected to the bit line BL, and the upper surface of the conductor cell 10 may be in contact with or connected to the word line WL. The conductor cell 10 may be integrated with at least one of the word line WL and the bit line BL. However, the plurality of conductor cells 10 may be formed by a conductive material other than metal.

The plurality of rectifying resistance change cell 20 may be, for example, self-rectifying memristors. A self-rectifying memristor may have a rectifying characteristic to allow current to flow in only one direction (i.e., forward direction) and also have a characteristic to store a changeable resistance state. As a non-limiting example, the self-rectifying memristor may include an Hf oxide layer (e.g., $HfO_2$ layer) and an Al oxide layer (e.g., $Al_2O_3$ layer) stacked on the Hf oxide layer. However, the rectifying resistance change cell 20 is not limited to a self-rectifying memristor and may have other device configurations. For example, the rectifying resistance change cell 20 may be configured to include at least one of a diode, a transistor, and a variable resistor.

The plurality of rectifying resistance change cells 20 may be configured to be programmed according to graph data to be analyzed. The rectifying resistance change cell 20 may have a low-resistance state and a high-resistance state, where the low-resistance state may be one or more. When there are a plurality of low-resistance states, the rectifying resistance change cell 20 may be said to have a plurality of weights. Each of the plurality of rectifying resistance change cells 20 may be programmed to reflect the characteristics of the graph data.

Graph data to be analyzed with the crossbar array device according to an embodiment of the present invention may include a plurality of nodes and a plurality of edges connecting the plurality of nodes. The graph data may include a variety of data such as social networks, molecular structures, virus transmission networks, device designing information, subway maps, map information, route information, and air transportation information and brain activity-related information. Such graph data may be composed of a plurality of objects (nodes) and intermediate lines (edges) which explain (connect) their relationships. Information corresponding to the plurality of nodes may be mapped to the plurality of conductor cells 10, and information corresponding to the plurality of edges may be mapped to the plurality of rectifying resistance change cells 20. The graph data may be non-Euclidean type graph data, but in some cases, it may be Euclidean type graph data.

Since the crossbar array device according to an embodiment of the present invention may have a crossbar array (CBA) structure shorted in the main diagonal direction, it may be called as a main diagonal-shorted CBA (i.e., mCBA).

Figure 2A:
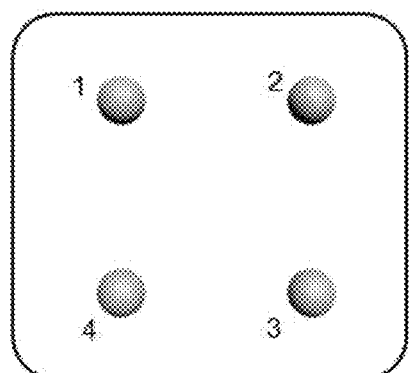
FIG. 2A to FIG. 2C are diagrams illustrating how graph data is mapped to a crossbar array device according to an embodiment of the present invention.
Figure 2A:
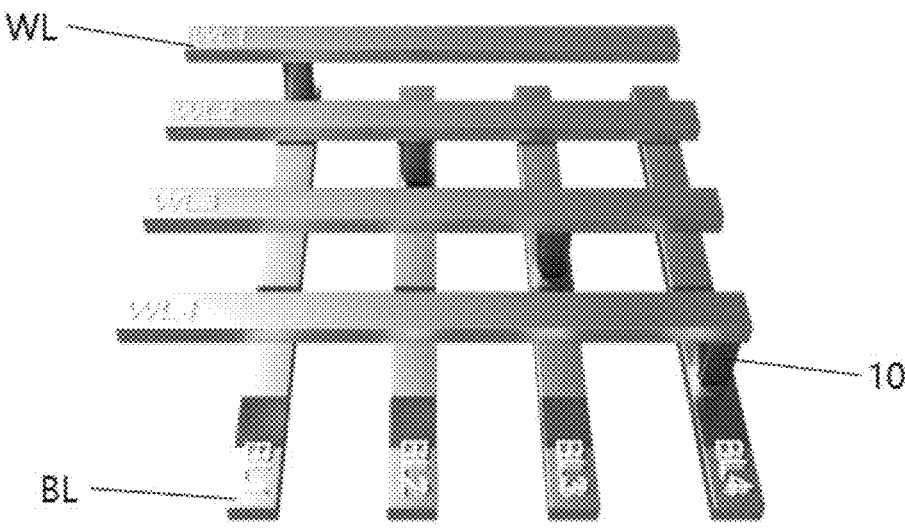
Figure 2B:
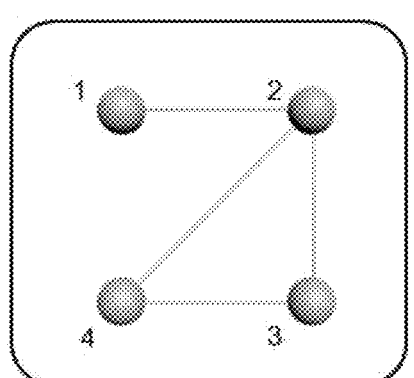
Figure 2B:
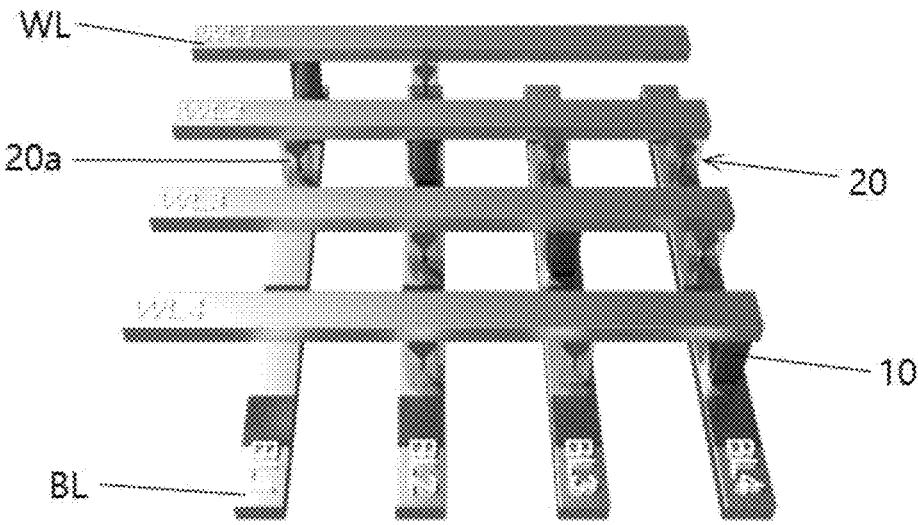
Figure 2C:
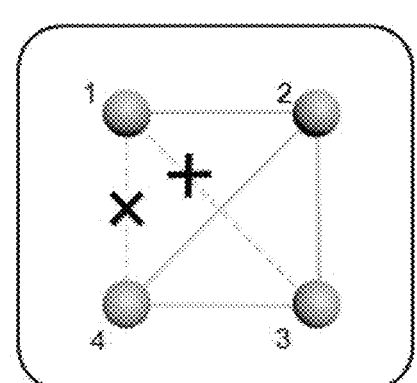
Figure 2C:
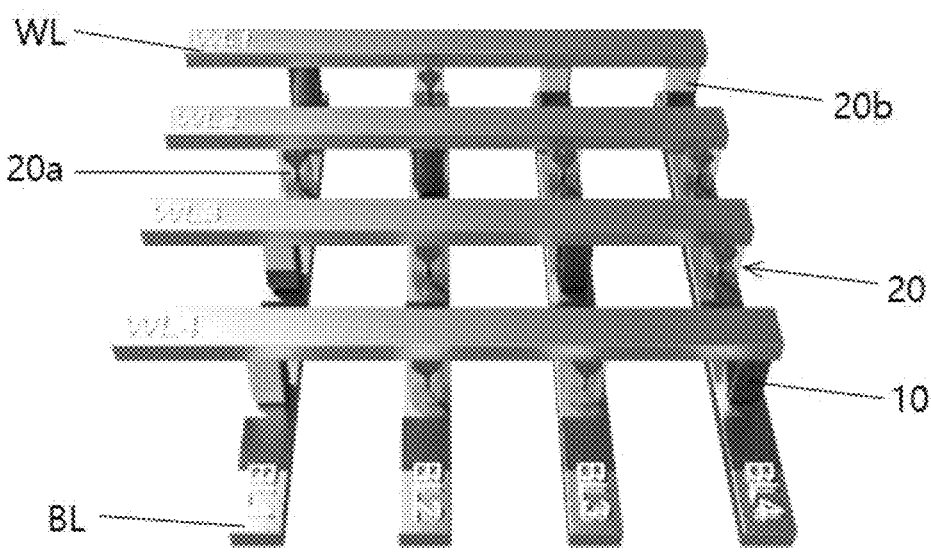

FIG. 2A to FIG. 2C are diagrams illustrating how graph data is mapped to a crossbar array device according to an embodiment of the present invention. The images disposed at the top of FIG. 2A to FIG. 2C represent graph data.

Referring to FIG. 2A, a plurality of nodes 1 to 4 of graph data may be mapped to the plurality of conductor cells 10 of the crossbar array device. Accordingly, it may be said that the plurality of conductor cells 10 respectively correspond to the plurality of nodes. The plurality of conductor cells 10 themselves may be regarded as a plurality of nodes.

Referring to FIG. 2B and FIG. 2C, the edges connecting the plurality of nodes 1 to 4 of the graph data may be mapped to the plurality of rectifying resistance change cells 20 of the crossbar array device. For example, since node 1 and node 2 are connected by an edge, this connection may be mapped as a rectifying resistance change cell 20a having a low resistance state (see FIG. 2B). If there is no difference between going from node 1 to node 2 and going from node 2 to node 1, that is, if there is no directionality, both of the rectifying resistance change cell 20a corresponding to the (1,2) cell, and the rectifying resistance change cell 20a corresponding to the (2,1) cell may have the same low resistance state. Meanwhile, since node 1 and node 4 are not connected, the rectifying resistance change cell 20b corresponding to the (1,4) cell may have a high resistance state (see FIG. 2C). The rectifying resistance change cell 20b having a high resistance state may serve to represent an unconnected portion (i.e., a non-edge portion). The rectifying resistance change cell 20b corresponding to the (4,1) cell may also have a high resistance state. Accordingly, the graph data as shown in FIG. 2C may be mapped to the crossbar array device.

Figure 3:
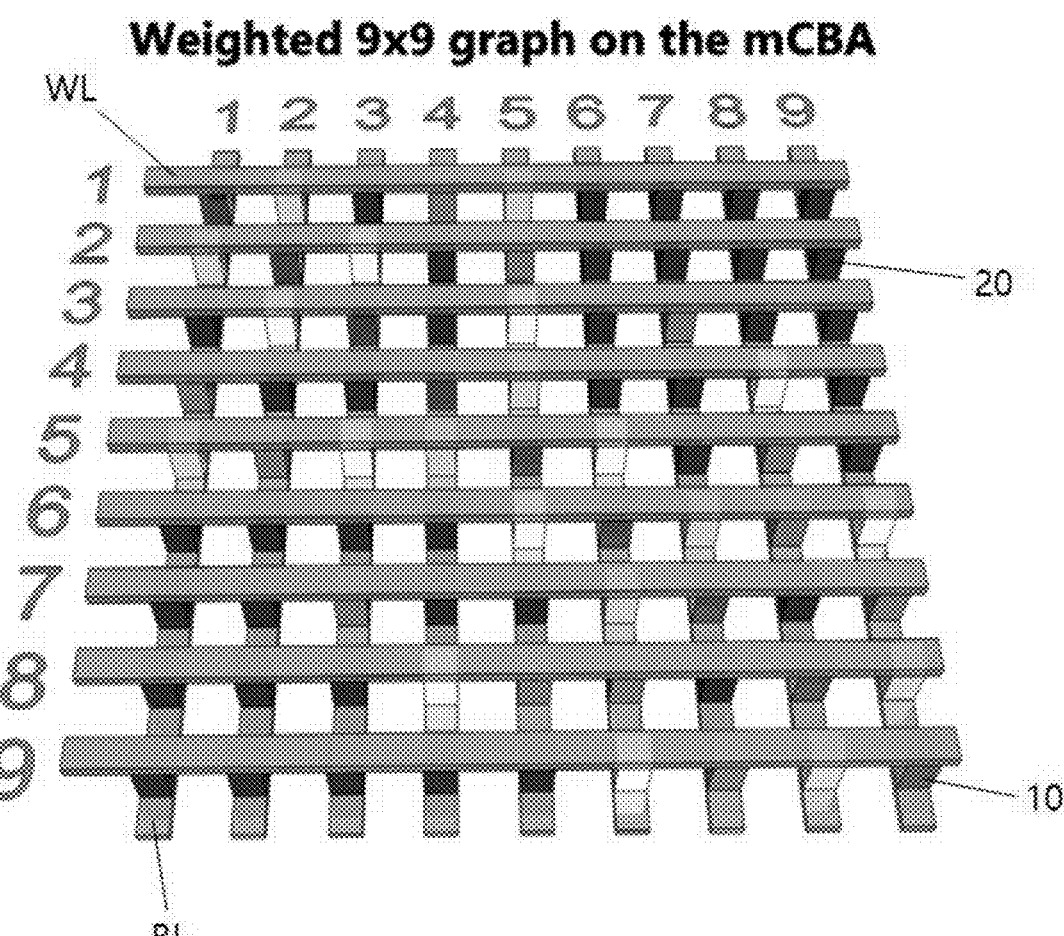
FIG. 3 is a perspective view showing a crossbar array device applicable to graph data analysis according to another embodiment of the present invention.

FIG. 3 is a perspective view showing a crossbar array device applicable to graph data analysis according to another embodiment of the present invention.

Referring to FIG. 3, a crossbar array device having a 9×9 array structure is disclosed. The crossbar array device may include a plurality of word lines WL, a plurality of bit lines BL, a plurality of conductor cells 10 disposed in intersection regions corresponding to a diagonal among a plurality of intersection regions defined between the plurality of word lines WL and the plurality of bit lines BL, and a plurality of rectifying resistance change cells 20 disposed in the remaining intersection regions excluding the diagonal among the plurality of intersection regions. The plurality of rectifying resistance change cells 20 may have a rectifying characteristic and may also have a characteristics to store a changeable resistance state. The rectifying resistance change cell 20 may have a low-resistance state and a high-resistance state, and the low-resistance state may be plural. When there are multiple low-resistance states, the rectifying resistance change cell 20 may be said to have multiple weights. The weight may be determined based on distance, cost, etc. Graph data to be analyzed by the crossbar array device may include a plurality of nodes and a plurality of edges connecting the plurality of nodes. Information corresponding to the plurality of nodes may be mapped to the plurality of conductor cells 10, and information corresponding to the plurality of edges may be mapped to the plurality of rectifying resistance change cells 20.

Figure 4:
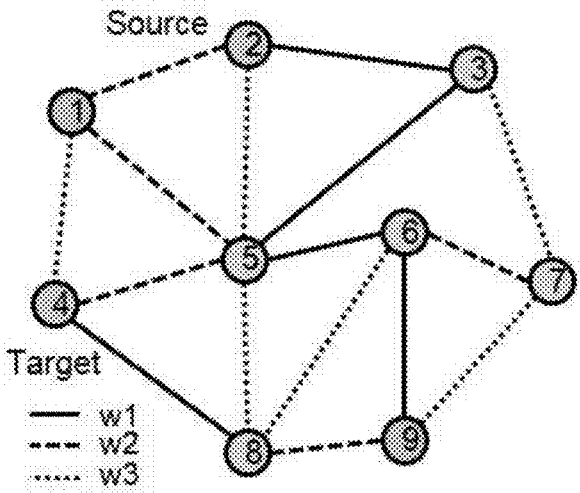
FIG. 4 is a diagram schematically showing a graph data which may be mapped to a crossbar array device according to an embodiment of the present invention.

FIG. 4 is a diagram schematically showing graph data which may be mapped to a crossbar array device according to an embodiment of the present invention.

Referring to FIG. 4, the graph data may have a plurality of nodes (1 to 9) and a plurality of edges connecting the plurality of nodes (1 to 9). The plurality of edges may have one of a plurality of weights (w1 to w3).

Figure 5:
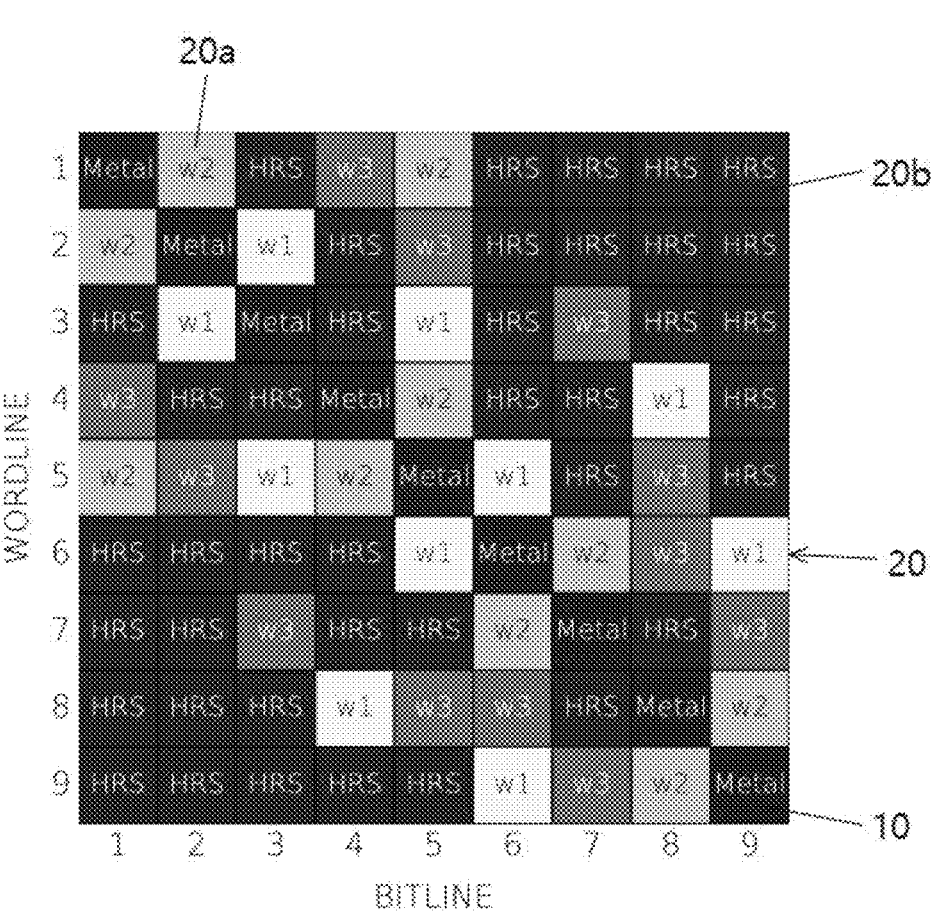
FIG. 5 is a diagram showing a case where the graph data as shown in FIG. 4 is mapped to a crossbar array device according to an embodiment of the present invention.

FIG. 5 is a diagram showing a case where the graph data as shown in FIG. 4 is mapped to a crossbar array device according to an embodiment of the present invention.

Referring to FIG. 5, the plurality of nodes (1 to 9) may be mapped to the plurality of conductor cells 10 as 1:1 ratio. Node 1 may be mapped to the (1,1) cell, node 2 may be mapped to the (2,2) cell. According to this manner, node 9 may be mapped to the (9, 9) cell. The plurality of edges may be mapped to a plurality of rectifying resistance change cells 20. The rectifying resistance change cell 20b having a high resistance state (HRS) refers to an unconnected portion (i.e., a non-edge portion). The rectifying resistance change cell 20a having a low resistance state (w1, w2, w3) refers to a connected portion (i.e., an edge portion). When there is no directionality of connection, the plurality of rectifying resistance change cells 20 may be programmed symmetrically with respect to the diagonal. According to another embodiment, when there is directionality of connection, the plurality of rectifying resistance change cells 20 may be programmed asymmetrically with respect to the diagonal.

Figures 6, 7:
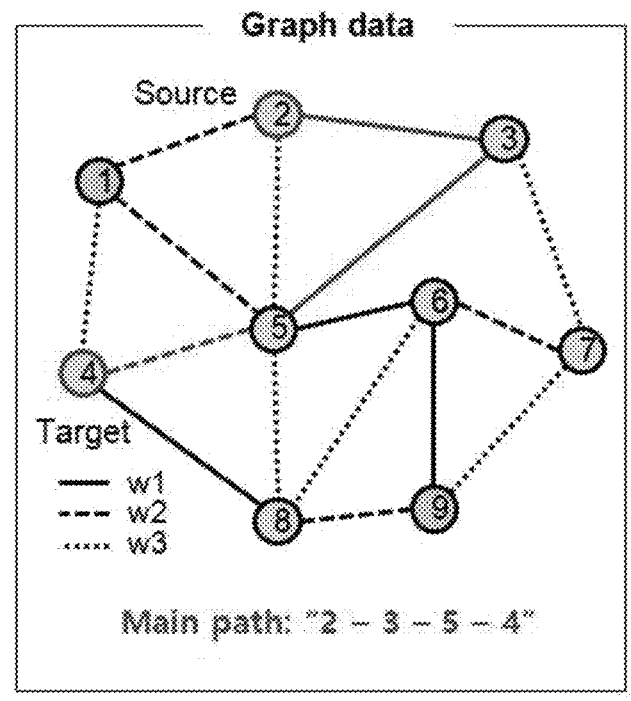
FIG. 6 is a diagram showing the flow of the main current when a voltage signal is applied to the second word line and a ground signal is applied to the fourth bit line of the crossbar array device according to an embodiment of the present invention.
FIG. 7 is a diagram showing a path of the main current generated in the crossbar array device of FIG. 6.

FIG. 6 is a diagram showing the flow of the main current when a voltage signal is applied to the second word line WL2 and a ground signal is applied to the fourth bit line BL4 of the crossbar array device according to an embodiment of the present invention. In FIG. 6, F may mean electrical floating.

Referring to FIG. 6, when a voltage signal is applied to the second word line WL2 and a ground signal is applied to the fourth bit line BL4, the generated main current may correspond to the shortest path from node 2 to node 4 in the actual data. This characteristic may be possible when the conductor cell 10 is disposed in the intersection region of the diagonal region, and the rectifying resistance change cell 20 is disposed in the intersection region other than the diagonal region. When node 2 is set as a source (i.e., a starting point) and node 4 is set as a target (i.e., a destination point), a main current matching the shortest path from node 2 to node 4 may be generated by applying a voltage signal to the second word line WL2 and applying a ground signal to the fourth bit line BL4. The second word line WL2 may be electrically equivalent to the node 2, and the fourth bit line BL4 may be electrically equivalent to the node 4. Accordingly, the second word line WL2 may be regarded as a source (i.e., a starting point), and the fourth bit line BL4 may be regarded as a target (i.e., a destination point).

FIG. 7 is a diagram showing a path of the main current generated in the crossbar array device of FIG. 6.

Referring to FIG. 7, the main current may flow from node 2 to node 4 via node 3 and node 5. At this time, a ratio of the main current (i.e., a current passing through the 2-3-5-4 path) to the total output current may be as high as 0.6.

The crossbar array device itself may have leakage current characteristics in which current flows toward a side having the lowest resistance. In an embodiment of the present invention, the current may be allowed to flow in the desired direction by disposing the conductor cell 10 in the diagonal region to short-circuit it, and disposing the rectifying resistance change cell 20 in the remaining intersection region excluding the diagonal region to control the flow of current. In other words, current may arrive at one node and flow to the next node. In the crossbar array device according to an embodiment of the present invention, similarity based on sneak current may be used for information analysis. Here, the similarity may mean distance or connectivity between nodes.

Figure 8:
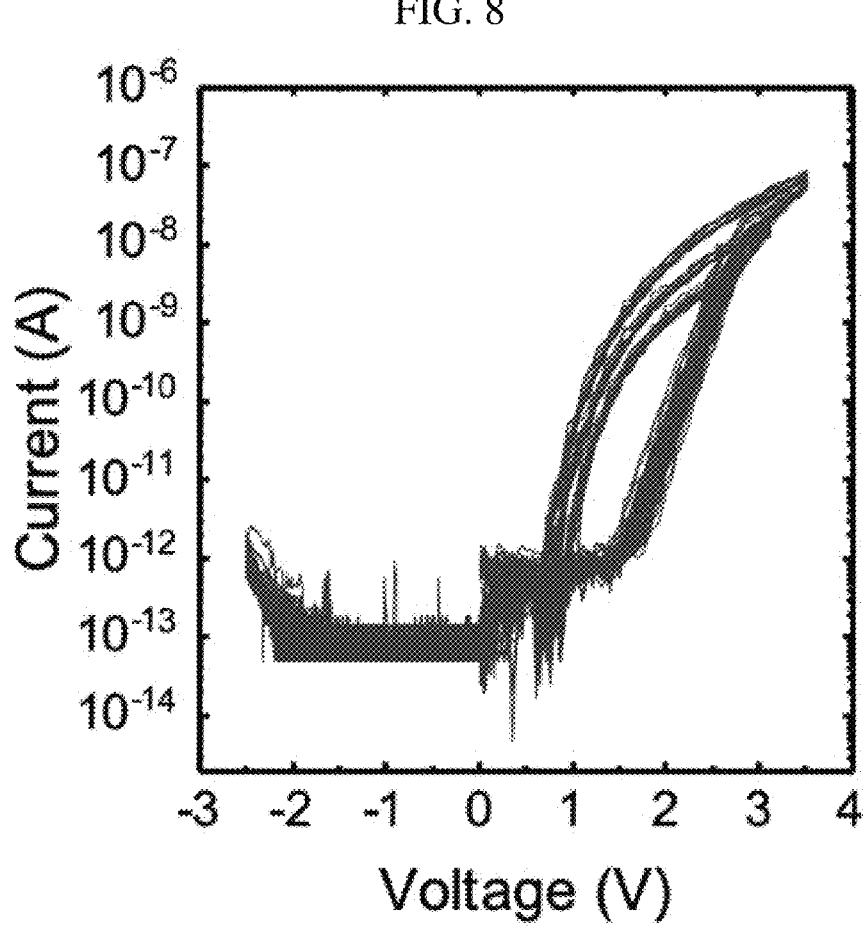
FIG. 8 is a graph illustrating voltage-current characteristic of a rectifying resistance change device which may be applied to a crossbar array device according to an embodiment of the present invention.

FIG. 8 is a graph illustrating voltage-current characteristic of a rectifying resistance change device which may be applied to a crossbar array device according to an embodiment of the present invention.

Referring to FIG. 8, the rectifying resistance change device which may be applied to the crossbar array device according to an embodiment of the present invention may be, for example, a self-rectifying memristor. The rectifying resistance change device may have a rectifying characteristic and may have a characteristic to store a changeable resistance state.

Figure 9:
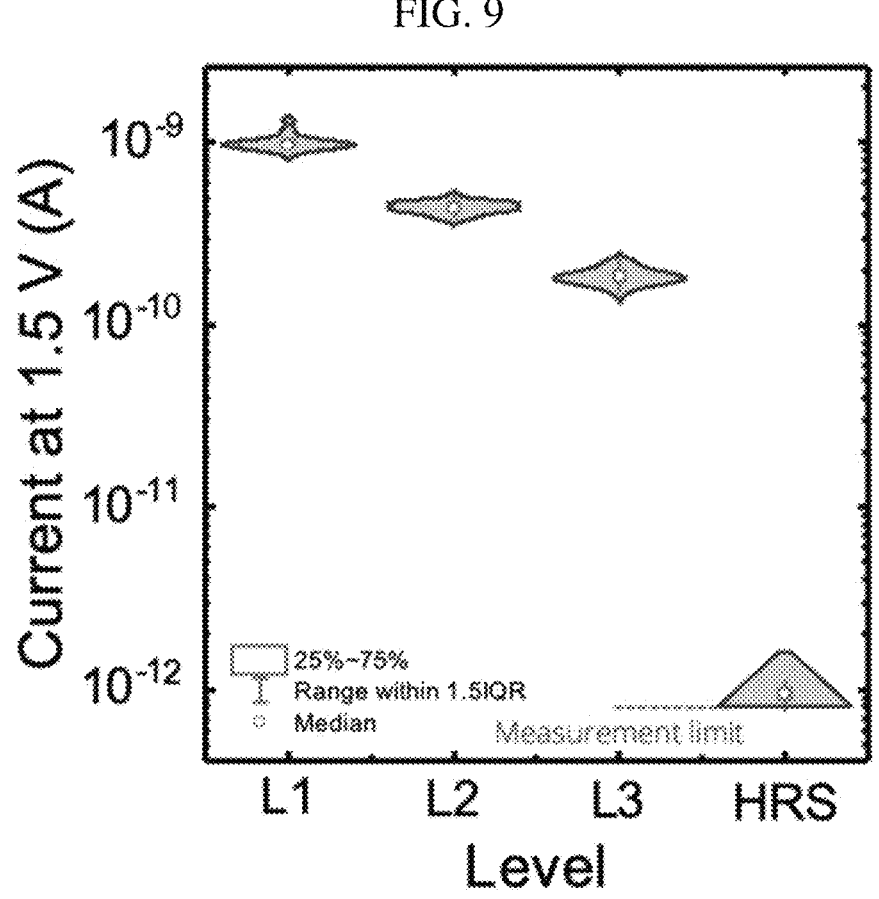
FIG. 9 is a graph illustrating various current levels which a rectifying resistance change device which may be applied to a crossbar array device according to an embodiment of the present invention may have.

FIG. 9 is a graph illustrating various current levels which a rectifying resistance change device which may be applied to a crossbar array device according to an embodiment of the present invention may have.

Referring to FIG. 9, the rectifying type resistance change device may have a high resistance state (HRS) and a plurality of low resistance states (L1, L2, and L3).

Figure 10:
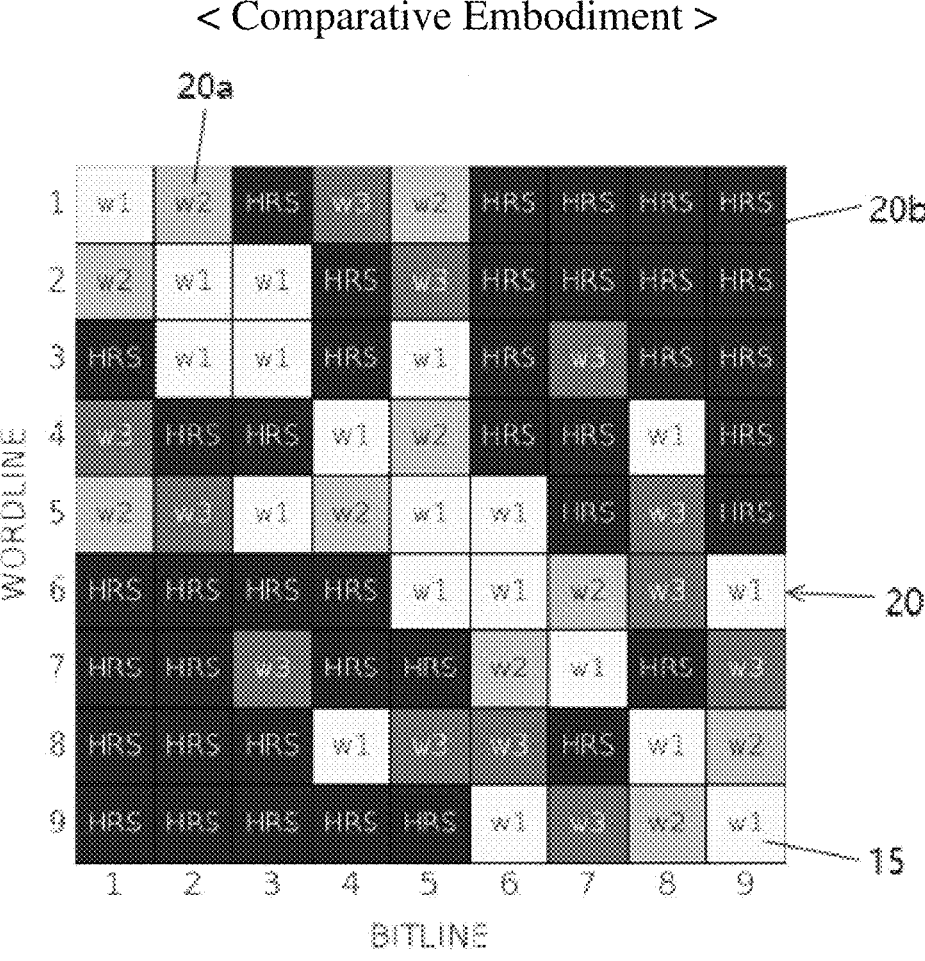
FIG. 10 is a diagram for explaining a crossbar array device according to a comparative example.

FIG. 10 is a diagram for explaining a crossbar array device according to a comparative example.

Referring to FIG. 10, the crossbar array device according to the comparative example indicates a case that the conductor cell 10 is not disposed in the diagonal region in the crossbar array device according to the embodiment described in FIG. 5, but instead, the rectifying resistance change cell 15 having a low resistance state corresponding to the first weight w1 is disposed.

Figure 11:
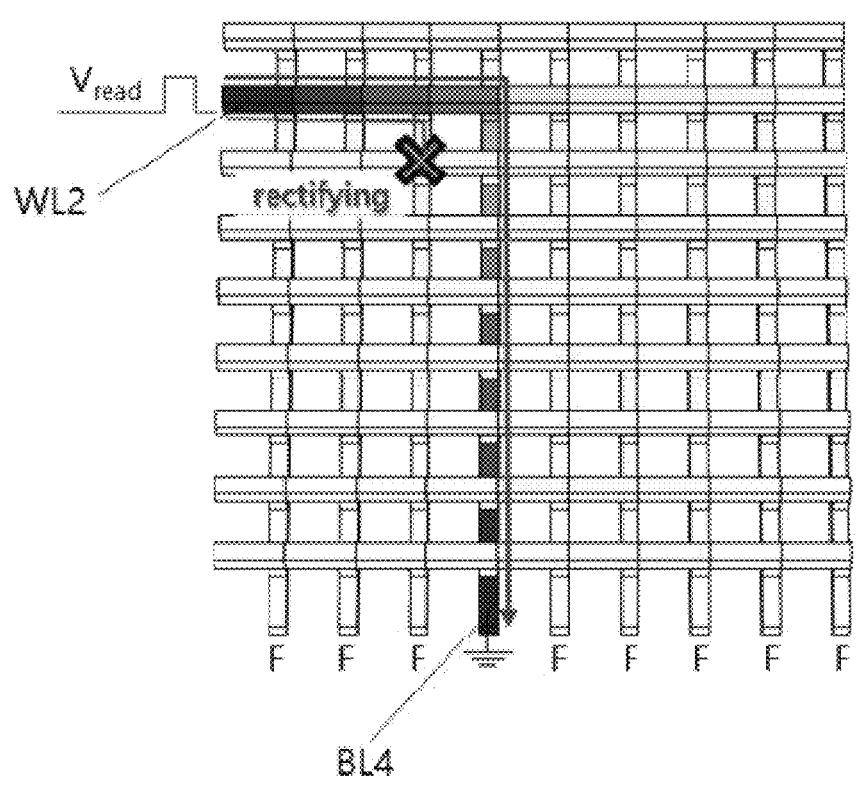
FIG. 11 is a diagram showing a flow of current when a voltage signal is applied to the second word line and a ground signal is applied to the fourth bit line of the crossbar array device according to the comparative example of FIG. 10.

FIG. 11 is a diagram showing a flow of current when a voltage signal is applied to the second word line WL2 and a ground signal is applied to the fourth bit line BL4 of the crossbar array device according to the comparative example of FIG. 10.

Referring to FIG. 11, the crossbar array device according to the comparative example may operate in the same manner as a typical conventional array device. Here, the leakage current is suppressed and thus, an operation to read the accessed cell itself may be performed. In the structure of FIG. 6 according to an embodiment, an operation in which a current arrives at one node and moves to another node may be performed, but this operation may not be performed in FIG. 11. In FIG. 11, as only current flows through the accessed cell, only memory operation is possible. In this case, a ratio of the current through the above-mentioned specific path (i.e., the path of 2-3-5-4) to the total output current was as low as 0.004.

Figure 12:
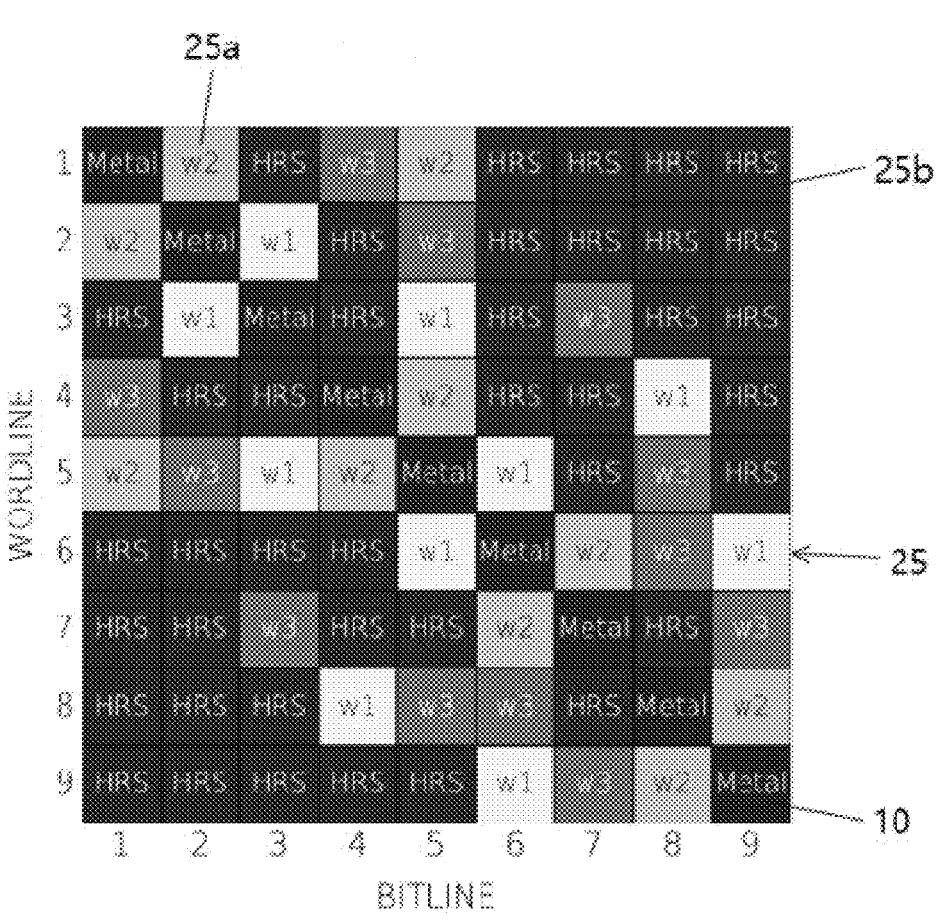
FIG. 12 is a diagram for explaining a crossbar array device according to a comparative example.

FIG. 12 is a diagram for explaining a crossbar array device according to a comparative example.

Referring to FIG. 12, the crossbar array device according to the comparative example is a case where the non-rectifying resistance change cell 25 is disposed in the remaining intersection region excluding the diagonal region in the crossbar array device according to the embodiment described in FIG. 5. The non-rectifying resistance change cell 25 is a symmetric memristor. The reference number 25*a* represents a non-rectifying resistance change cell having a low resistance state, and 25*b* represents a non-rectifying resistance change cell having a high resistance state.

Figure 13:
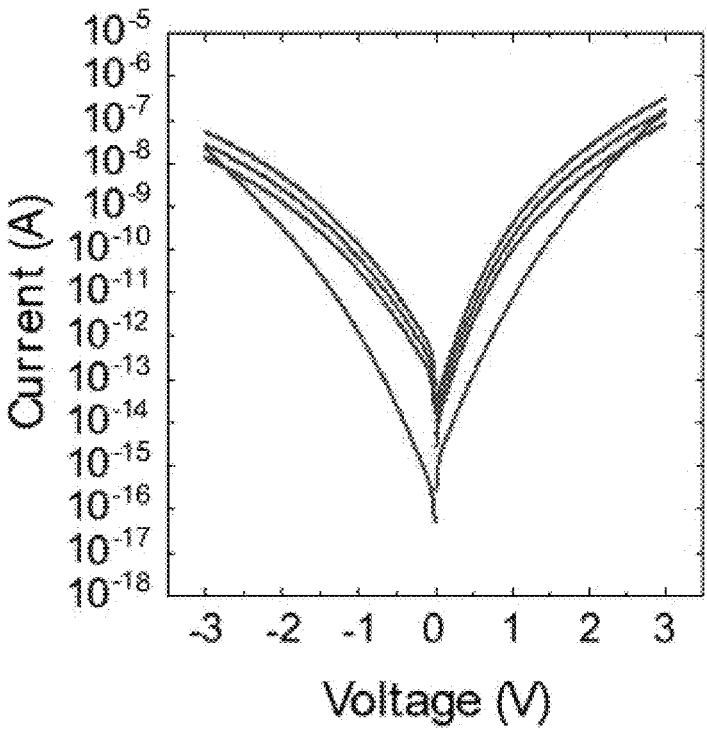
FIG. 13 is a graph showing voltage-current characteristic of a resistance change cell of a non-rectifying type of FIG. 12.

FIG. 13 is a graph showing voltage-current characteristic of a non-rectifying resistance change cell 25 of FIG. 12.

Referring to FIG. 13, it may be seen that the non-rectifying resistance change cell 25 exhibits symmetrical voltage-current characteristics. The non-rectifying resistance change cell 25 may have characteristics which allow current to flow well in both of forward and reverse directions in a low-resistance state.

Figure 14:
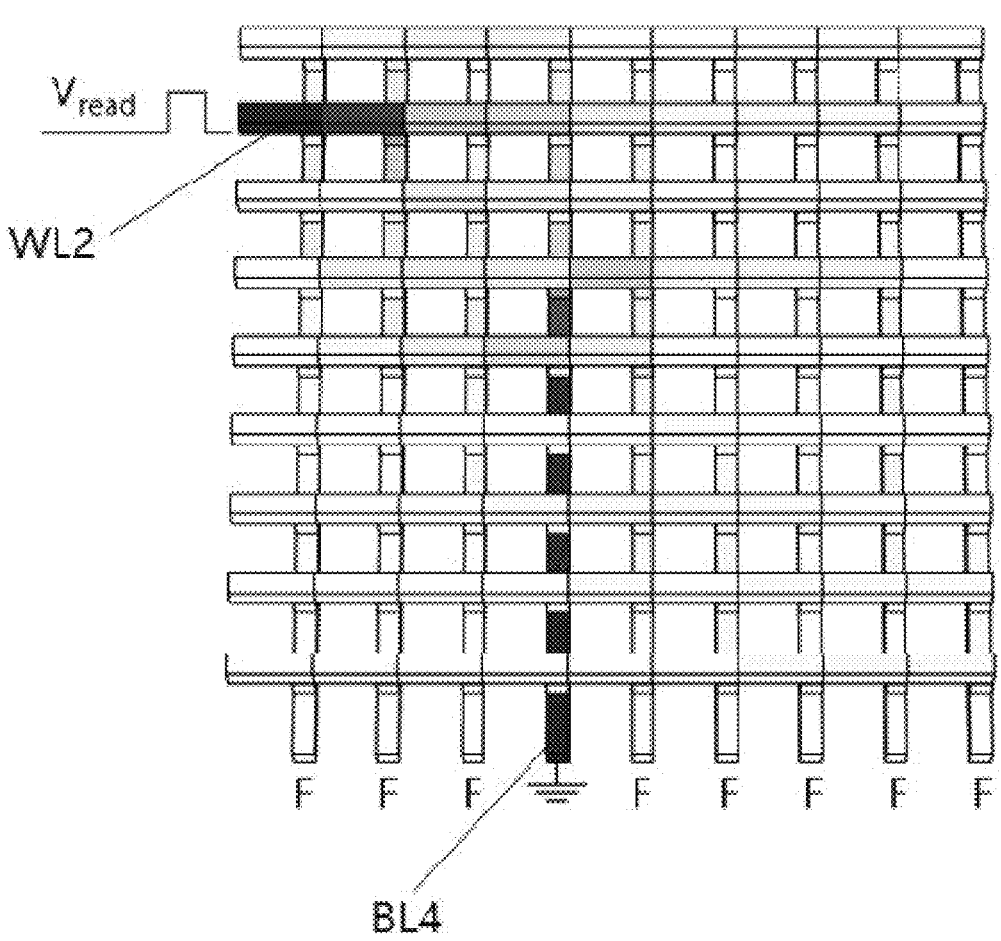
FIG. 14 is a diagram showing a flow of current when a voltage signal is applied to the second word line and a ground signal is applied to the fourth bit line of the crossbar array device according to the comparative example of FIG. 12.

FIG. 14 is a diagram showing a flow of current when a voltage signal is applied to the second word line WL2 and a ground signal is applied to the fourth bit line BL4 of the crossbar array device according to the comparative example of FIG. 12.

Referring to FIG. 14, it may be seen that since the current is not rectified in the crossbar array device according to the comparative example, the current flows generally randomly. This may be because the current path is not refined and currents collide in multiple paths. In this case, a ratio of the current through the above-mentioned specific path (i.e., the path of 2-3-5-4) to the total output current was as low as −0.0067.

As a result of comparing the structure and measurement results of FIGS. 5, 6, 10, 11, 12, and 14, it may be seen that only when the conductor cell 10 is disposed in the diagonal region and the rectifying resistance change cell 20 is disposed in the remaining region excluding the diagonal region as in the embodiment of the present invention, the flow of current may be generated in a desired direction.

The crossbar array device according to an embodiment of the present invention may be usefully used in neuromorphic devices (neuromorphic systems) and neural networks.

A graph data analysis method using a crossbar array device according to an embodiment of the present invention may include a step for preparing a crossbar array device, a step for mapping a graph data to be analyzed to the crossbar array device, and a step for performing measurement on (for) the crossbar array device to which the graph data is mapped. The crossbar array device may be the same as described with reference to FIGS. 1 to 3, and the like. The crossbar array device may include a plurality of word lines extending in a first direction, a plurality of bit lines extending in a second direction intersecting the plurality of word lines, a plurality of conductor cells disposed in intersection regions corresponding to a diagonal among a plurality of intersection regions defined between the plurality of word lines and the plurality of bit lines, and a plurality of rectifying resistance change cells disposed in remaining intersection regions excluding the diagonal among the plurality of intersection regions, having a rectifying characteristic and having a characteristic to store a changeable resistance state.

The plurality of conductor cells may be disposed in intersection regions corresponding to a main diagonal in the plurality of intersection regions. As a non-limiting example, the plurality of conductor cells may be a metal cell. As a non-limiting example, the plurality of rectifying resistance change cells may be a self-rectifying memristor.

The graph data may include a plurality of nodes and a plurality of edges connecting the plurality of nodes. In the step of mapping the graph data, information corresponding to the plurality of nodes may be mapped to the plurality of conductor cells, and information corresponding to the plurality of edges may be mapped to the plurality of rectifying resistance change cells.

The step for performing measurement on the crossbar array device may include a step for performing a single ground method (SGM) measurement. In the step for performing the single ground method (SGM) measurement, a read signal may be applied to one word line selected among the plurality of word lines and a ground signal may be applied to one bit line selected among the plurality of bit lines.

The step for performing measurement on the crossbar array device may include a step for performing a multi-ground method (MGM) measurement. In the step for performing the multi-ground method (MGM) measurement, a read signal may be applied to one word line connected to a conductor cell selected from the plurality of conductor cells among the plurality of word lines, and a ground signal may be applied to at least two of remaining bit lines excluding a bit line connected to the selected conductor cell among the plurality of bit lines.

Figure 15:
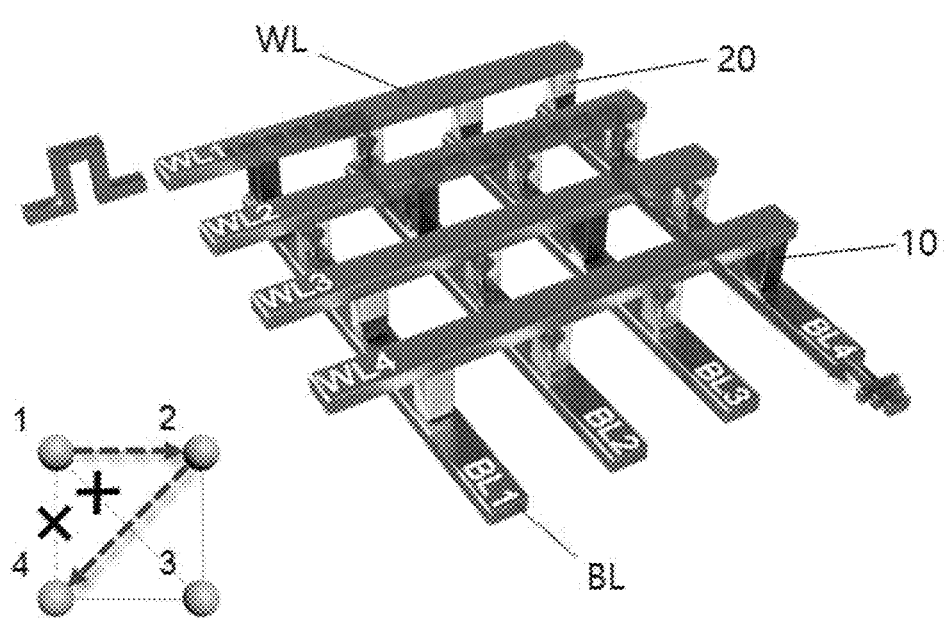
FIG. 15 is a perspective view for explaining a single ground method (SGM) measurement which may be applied to a crossbar array device according to an embodiment of the present invention.

FIG. 15 is a perspective view for explaining a single ground method (SGM) measurement which may be applied to a crossbar array device according to an embodiment of the present invention.

Referring to FIG. 15, a single ground method (SGM) measurement may be performed by applying a read signal (voltage signal) to one word line WL1 selected from among the plurality of word lines WL and applying a ground signal to one bit line BL4 selected from the plurality of bit lines BL. The remaining bit lines BL1 to BL3 may be floating. This case may be referred to as SGM$_{1,4}$ measurement. In this case, the current may flow along the shortest path from node 1 to node 4. In other words, the current may flow from node 1 to node 4 through node 2. Since reverse current is prevented by the rectifying resistance change cell 20, sneak current may only flow through the conductor cells 10 arranged in a diagonal direction. This SGM$_{1,4}$ measurement may be used to confirm information between node 1 and node 4. The information may include information related to similarity between node 1 and node 4. The similarity may mean distance or connectivity between nodes. Therefore, single ground method (SGM) measurement, that is, SGM measurement, may be called a "similarity function."

Figure 16:
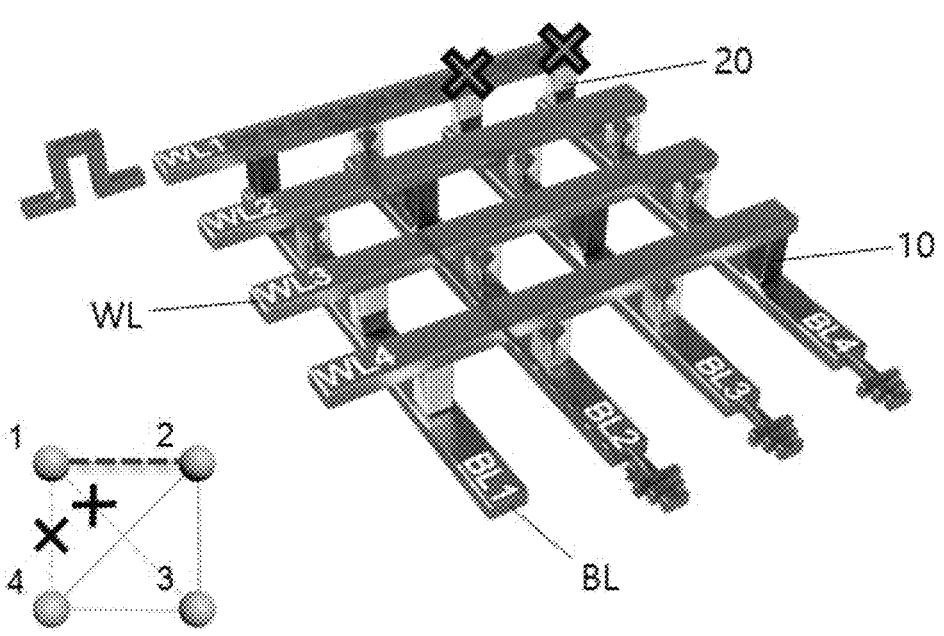
FIG. 16 is a perspective view to explain a multi-ground method (MGM) measurement which may be applied to a crossbar array device according to an embodiment of the present invention.

FIG. 16 is a perspective view to explain a multi-ground method (MGM) measurement which may be applied to a crossbar array device according to an embodiment of the present invention.

Referring to FIG. 16, a multi-ground method (MGM) measurement may be performed by applying a read signal (voltage signal) to one word line WL connected to a conductor cell [e.g., a conductor cell corresponding to a (1,1) cell] selected from the plurality of conductor cells 10 among the plurality of word lines WL, and applying a ground signal to the remaining bit lines (BL2 to BL4) excluding the bit line BL1 connected to the selected conductor cell among the plurality of bit lines BL. The first bit line BL1 may be floating. In this case, since leakage current is suppressed, an operation similar to a general memory operation may be performed. In this embodiment, current may flow from node 1 to the second bit line BL2, but current may not flow to the third bit line BL3 and the fourth bit line BL4. This may mean that the node around node 1 is node 2. In other words, since current may flow to the node directly connected to node 1, it may be confirmed that the node directly connected to node 1 is node 2. Therefore, multi-ground method (MGM) measurement, that is, MGM measurement, may be performed as a function to search for an adjacent node. In this respect, the MGM measurement may be referred to as an "adjacency search function." Furthermore, the MGM measurement may be said to be a function to read information mapped to (stored in) the crossbar array device.

The crossbar array device according to an embodiment of the present invention may have both of a memory function to store graph data and read the stored data, and a process function to analyze the stored data and obtain hidden information. The memory function may be performed by MGM measurement, and the process function may be performed by SGM measurement. The crossbar array device may be said to have "process in memory" characteristics.

Various algorithms may be performed by using the above-described SGM measurement and MGM measurement. For example, various algorithms such as pathfinding, link prediction, and community detection may be performed.

Figure 17:
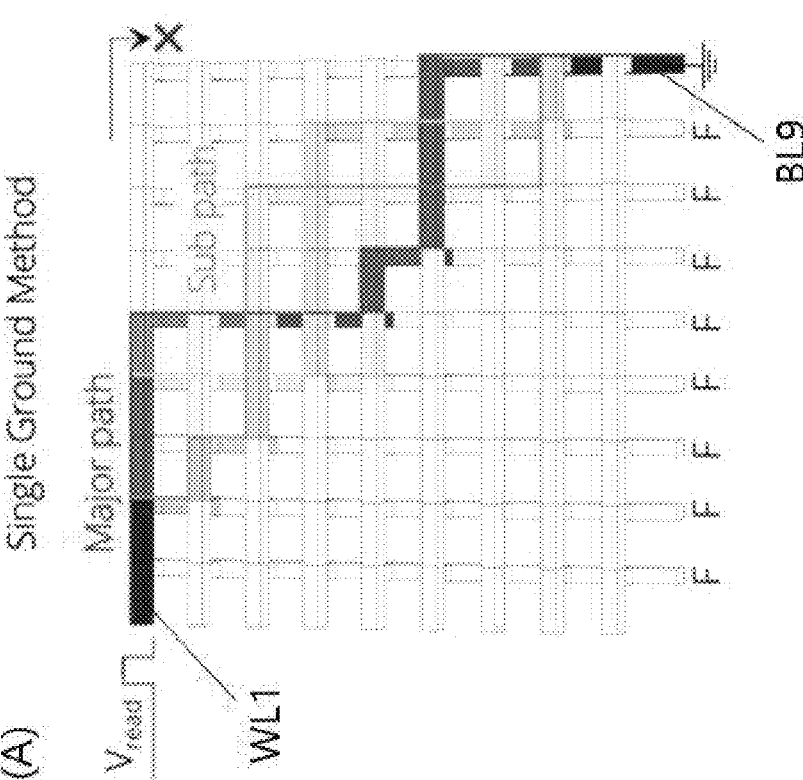
FIG. 17 is a perspective view for explaining a single ground method (SGM) measurement which may be applied to a crossbar array device according to an embodiment of the present invention.

FIG. 17 is a perspective view for explaining a single ground method (SGM) measurement which may be applied to a crossbar array device according to an embodiment of the present invention.

Referring to FIG. 17, a single ground method (SGM) measurement may be performed by applying a read signal (voltage signal) to one word line WL1 selected among a plurality of word lines, and applying a ground signal to one bit line BL9 selected among a plurality of bit lines. The remaining bit lines may be floated. In this case, electrons may flow through various parallel paths, and the output current may include various information between two nodes of interest, that is, node 1 and node 9.

Figure 18:
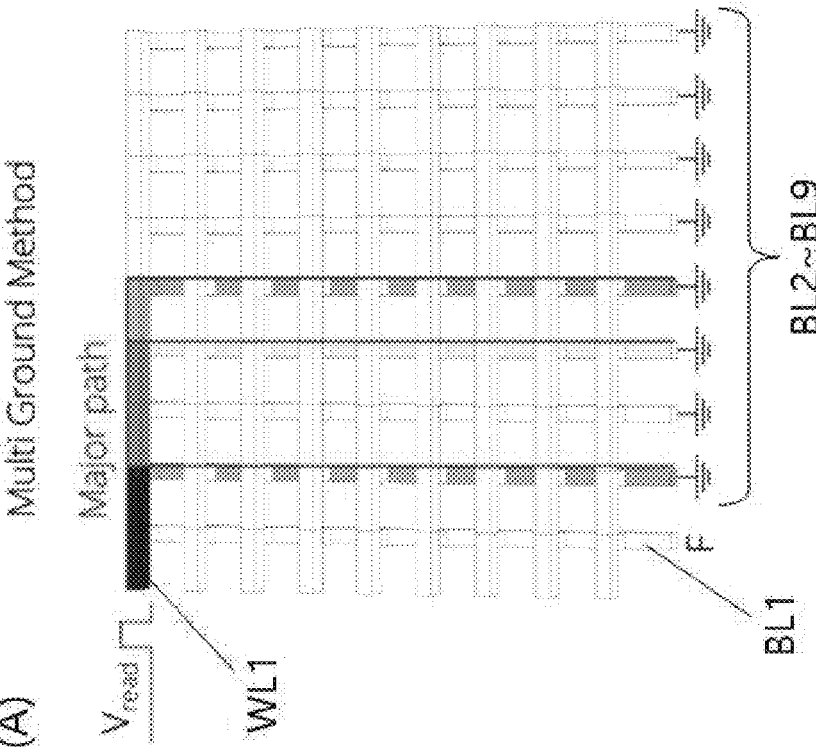
FIG. 18 is a perspective view for explaining a multi-ground method (MGM) measurement which may be applied to a crossbar array device according to an embodiment of the present invention.

FIG. 18 is a perspective view for explaining a multi-ground method (MGM) measurement which may be applied to a crossbar array device according to an embodiment of the present invention.

Referring to FIG. 18, a multi-ground method (MGM) measurement may be performed by applying a read signal (voltage signal) to one word line WL1 connected to a conductor cell [e.g., a conductor cell corresponding to a (1,1) cell] selected from a plurality of conductor cells among a plurality of word lines, and applying a ground signal to the remaining bit lines (BL2 to BL9) except for the bit line BL1 connected to the selected conductor cell among the plurality of bit lines. The first bit line BL1 may be floated. In this case, since current may flow to an adjacent node directly connected to node 1, current may flow to node 2, node 4, and node 5 directly connected to node 1. Therefore, it is possible to search adjacent nodes directly connected to a specific node. Furthermore, the strength of the connection or information related to the connection may be confirmed by measuring the level of current flowing to node 2, node 4, and node 5.

As mentioned earlier, if SGM measurements and MGM measurements are properly used, various algorithms such as pathfinding, link prediction, community detection, and the like may be easily performed. Furthermore, when performing algorithms, reliability and accuracy may be improved, time may be shortened, and power consumption may be reduced.

The graph data analysis method according to an embodiment of the present invention may include a step for performing a pathfinding algorithm, and a step for performing a multi-ground method (MGM) measurement and a step for performing a single-ground method (SGM) measurement may be alternately repeated in the step for performing the pathfinding algorithm. The pathfinding algorithm may be an algorithm to find a shortest or an optimal path from a source (starting point) to a target (destination point).

Figure 19A:
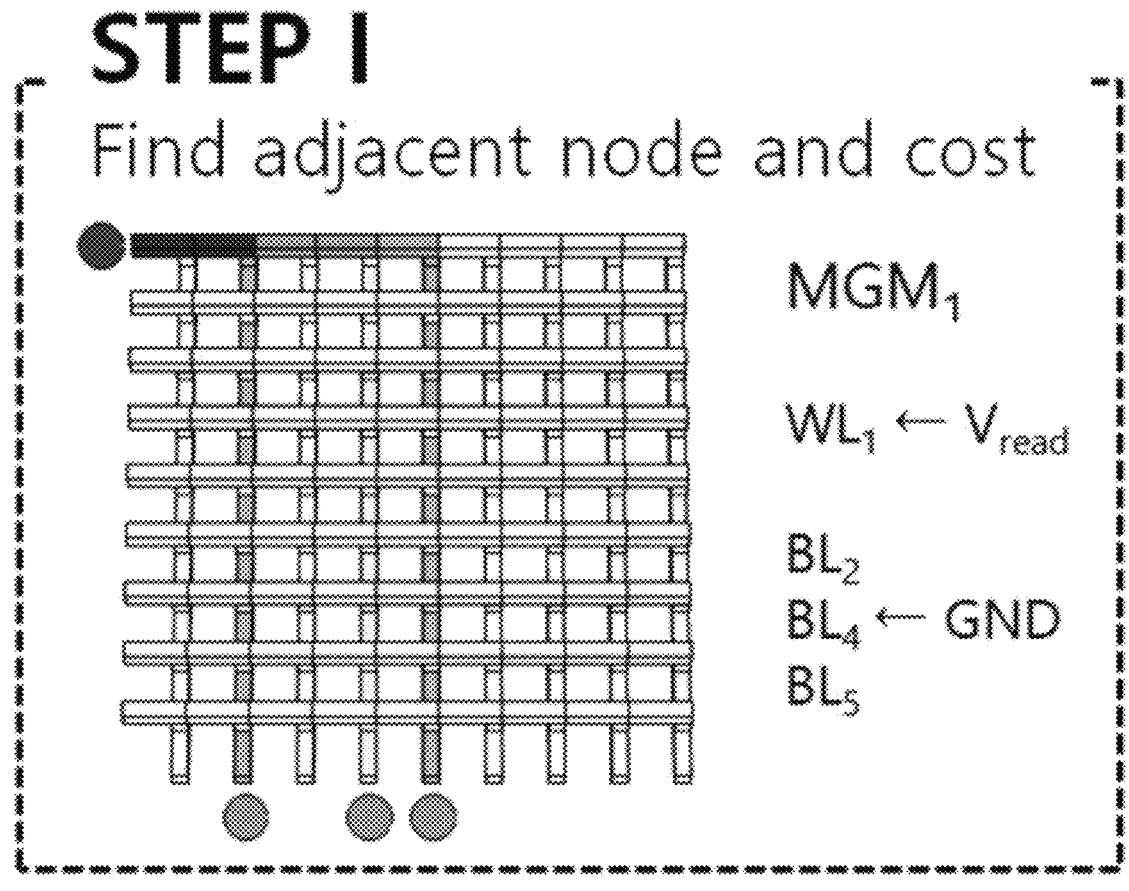
FIGS. 19A and 19B are diagrams for explaining a process for performing a pathfinding algorithm in a graph data analysis method using a crossbar array device according to an embodiment of the present invention.
Figure 19B:
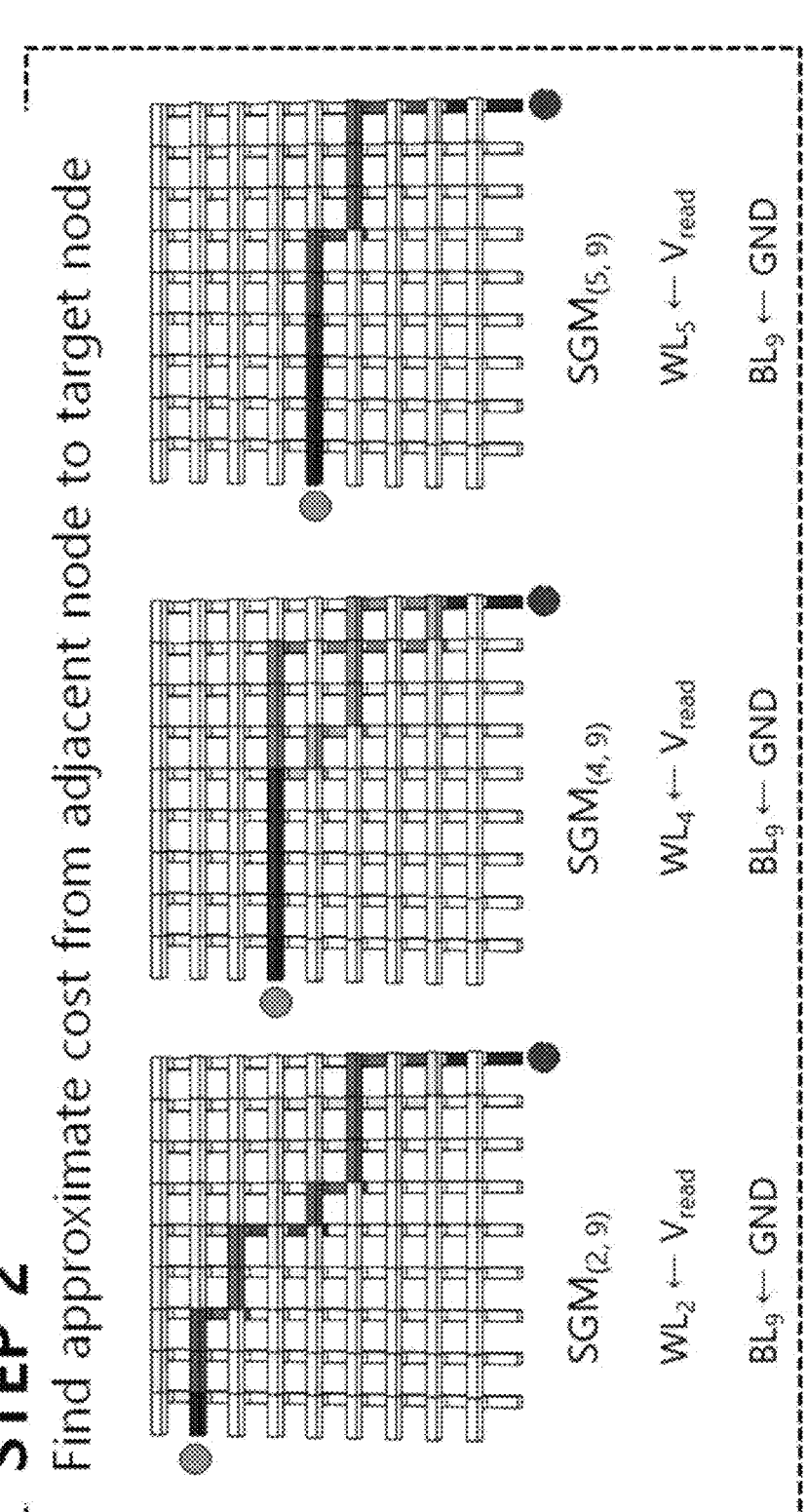

FIGS. 19A and 19B are diagrams for explaining a process for performing a pathfinding algorithm in a graph data analysis method using a crossbar array device according to an embodiment of the present invention. FIGS. 19A and 19B are for explaining the process for finding an optimal path when moving from node 1 to node 9 in the graph data of FIG. 4.

Referring to FIG. 19A, first of all, MGM measurement (i.e., MGM$_1$ measurement) may be performed to search adjacent nodes for node 1. Through this step, it is possible to confirm which adjacent nodes are directly connected to node 1, and the distance or cost for each adjacent node may be confirmed. It may be understood that the larger the weight of the connection, the greater the cost or the greater the distance. Therefore, the weight of the connection may be called the MGM cost. In this embodiment, adjacent nodes directly connected to node 1 may be node 2, node 4, and node 5. A step in FIG. 19A may be referred to as a step 1.

Referring to FIG. 19B, SGM measurement up to the node 9 corresponding to a target may be performed for each of the node 2, node 4, and node 5 which are confirmed to be connected to the node 1. That is, SGM$_{(2,9)}$ measurement, SGM$_{(4,9)}$ measurement and SGM$_{(5,9)}$ measurement may be performed respectively. The connectivity from node 2 to node 9, the connectivity from node 4 to node 9, and the connectivity from node 5 to node 9 may be confirmed respectively through this process. It is possible to determine which SGM measurement current is the highest by checking the SGM measurement current. In the case of this embodiment, the SGM measurement current from node 5 to node 9 was found to be the highest. The reciprocal of this current value may correspond to the distance. The reciprocal of the current value may be called SGM cost. The sum of the SGM cost and the MGM cost may be referred to as F score, and as F score is getting smaller, it may be judged that the cost is the smallest or the distance is shortest. A step in FIG. 19B may be referred to as a step 2.

After setting the node with the smallest F score (here, node 5) as the next source node, it is possible to perform the processes of the step 1 and the step 2 once again for the next source node and node 9 which is the target node. In this way, the processes of the step 1 and the step 2 described above may be performed repeatedly.

Figure 20:
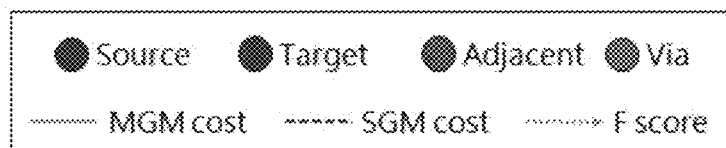
FIG. 20 is a diagram showing the results obtained by performing the process described in FIG. 19A and FIG. 19B.
Figure 20:
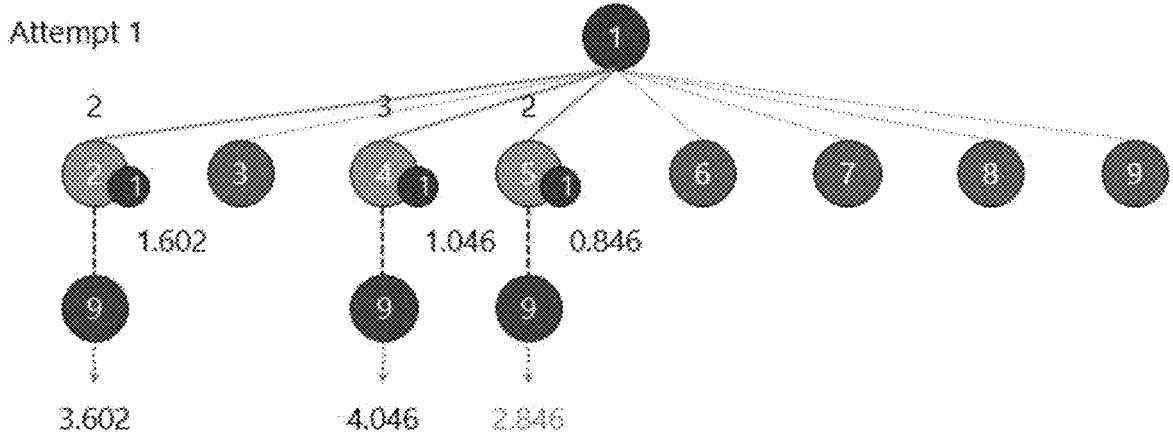
Figure 21:
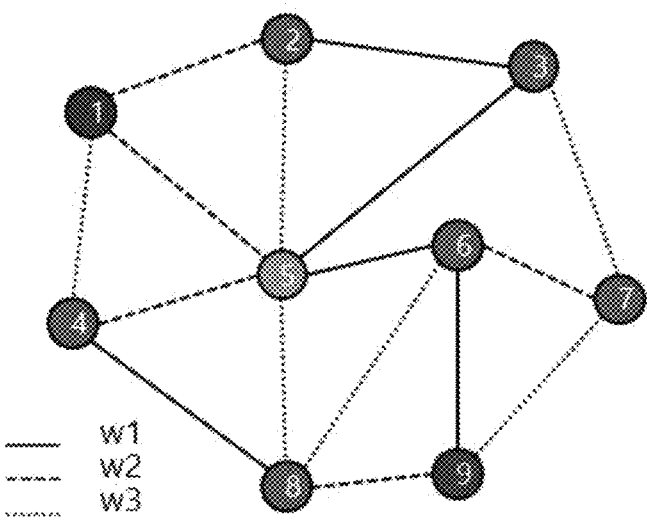
FIG. 21 is a diagram expressing the results of FIG. 20 in a graph data.

FIG. 20 is a diagram showing the results obtained by performing the process described in FIG. 19A and FIG. 19B. FIG. 21 is a diagram expressing the results of FIG. 20 in a graph data.

Referring to FIG. 20 and FIG. 21, the adjacent nodes connected to node 1 were node 2, node 4, and node 5, and among them, the node with the smallest F score was node 5. Therefore, node 5 may be set as the next source node. FIG. 20 may correspond to the first attempt, that is, Attempt 1.

Figure 22:
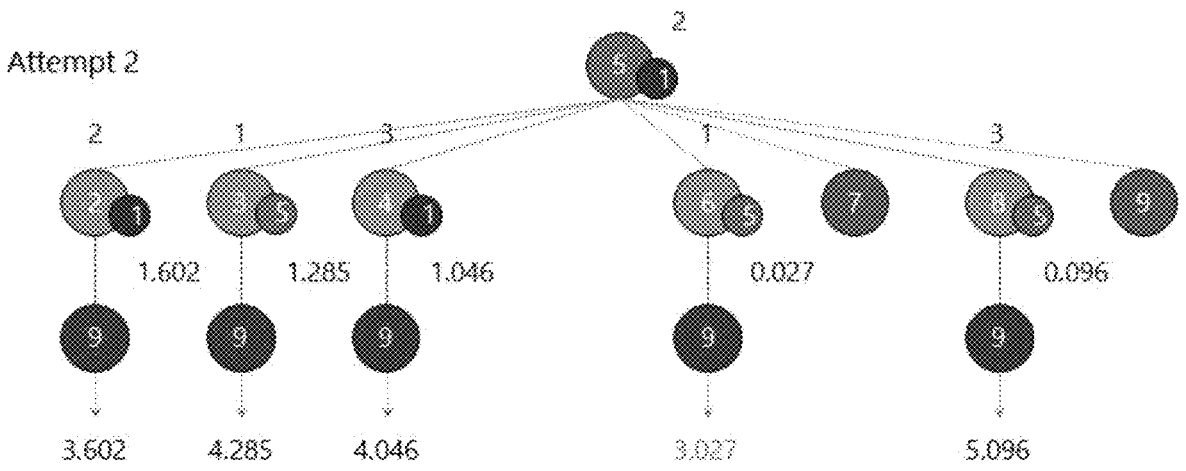
FIG. 22 is a diagram showing the results obtained by performing the above-described step 1 and step 2 processes after setting node 5 as the next source node.
Figure 23:
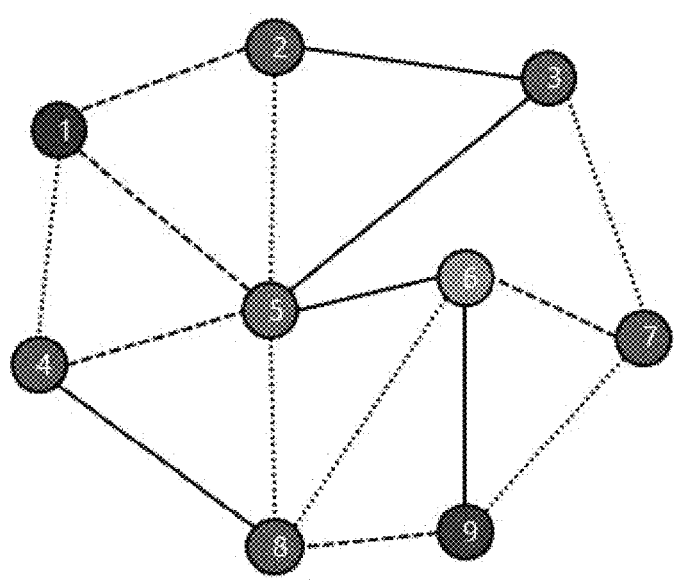
FIG. 23 is a diagram expressing the results of FIG. 22 in the graph data.

FIG. 22 is a diagram showing the results obtained by performing the above-described step 1 and step 2 processes after setting node 5 as the next source node. FIG. 23 is a diagram expressing the results of FIG. 22 in the graph data.

Referring to FIG. 22 and FIG. 23, the node with the smallest F score was node 6 among the adjacent nodes connected to node 5. Therefore, node 6 may be set as the next source node. FIG. 22 may correspond to the second attempt, that is, Attempt 2.

Figure 24:
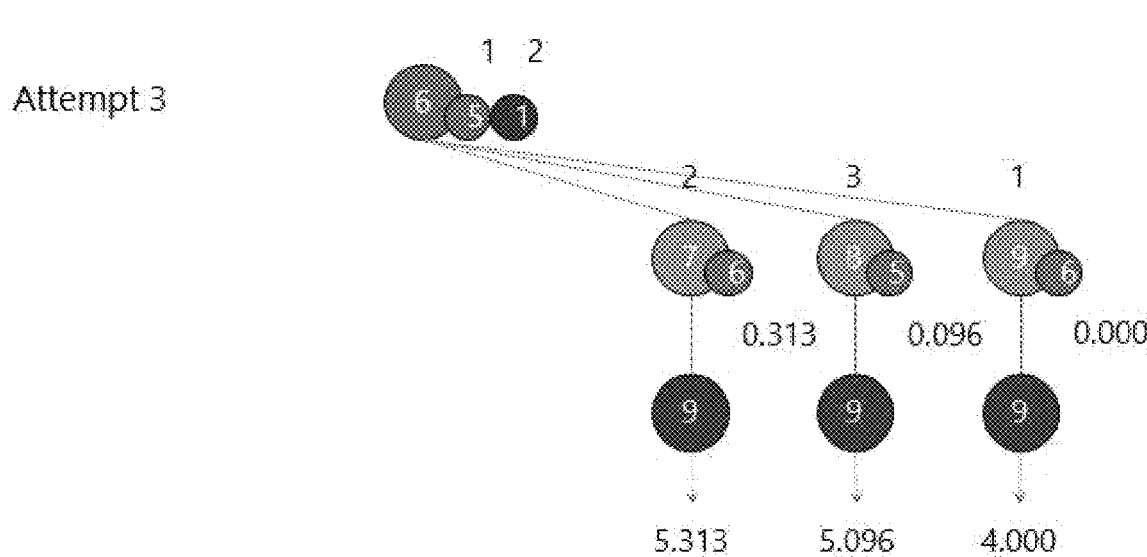
FIG. 24 is a diagram showing the results obtained by performing the above-described step 1 and step 2 processes after setting node 6 as the next source node.
Figure 25:
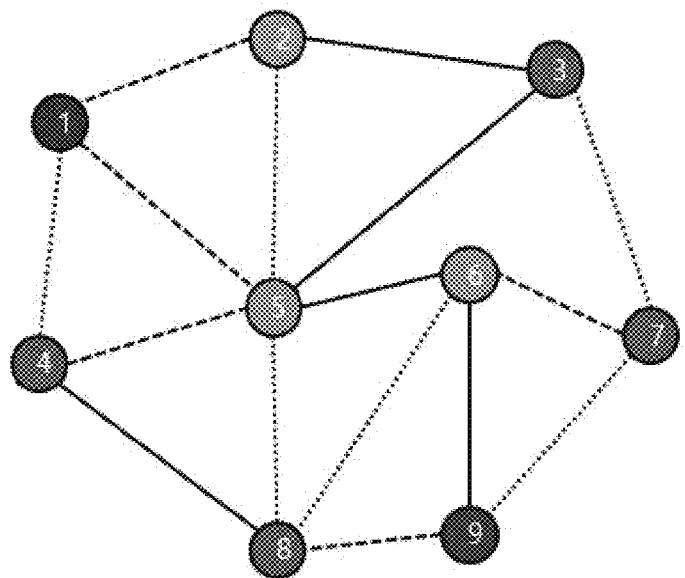
FIG. 25 is a diagram expressing the results of FIG. 24 in the graph data.

FIG. 24 is a diagram showing the results obtained by performing the above-described step 1 and step 2 processes after setting node 6 as the next source node. FIG. 25 is a diagram expressing the results of FIG. 24 in the graph data.

Referring to FIG. 24 and FIG. 25, the node with the smallest F score was node 9 among the adjacent nodes connected to node 6. Going directly from node 6 to node 9 may be less expensive than going to node 9 via node 7 or node 8. FIG. 24 may correspond to the third attempt, that is, Attempt 3.

Figures 26, 27:
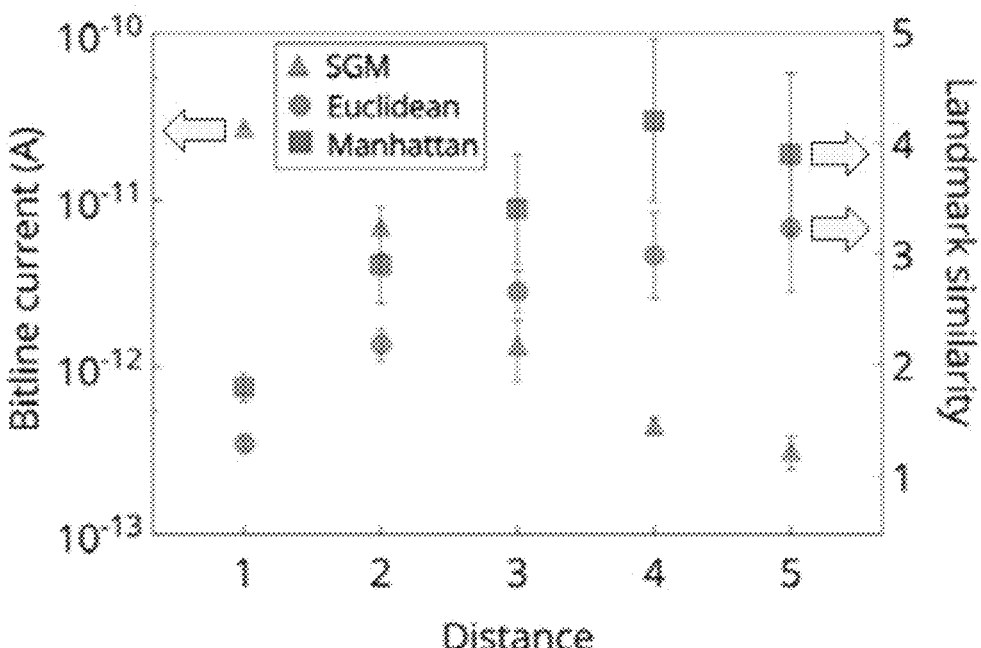
FIG. 26 is a diagram showing the results of pathfinding from node 1 to node 9 described with reference to FIG. 19A to FIG. 25.
FIG. 27 is a graph organizing the shortest path distance estimation results of the pathfinding algorithm according to an embodiment of the present invention and an existing software-based landmark algorithm by distance.

FIG. 26 is a diagram showing the results of pathfinding from node 1 to node 9 described with reference to FIG. 19A to FIG. 25.

Referring to FIG. 26, as a result of the pathfinding algorithm described above, the optimal path to go from node 1 to node 9 may be a path going from node 1 to node 9 via node 5 and node 6.

The pathfinding algorithm according to an embodiment of the present invention may be much more sophisticated in its method of finding a path than the existing algorithm, and the average number of attempts may be much smaller. Furthermore, in the embodiment of the present invention, while the problem of overlapping values measured by distance does not occur, the existing algorithm has a problem that severe overlapping of values measured by distance occur, and the calculation reliability may decrease. Therefore, the pathfinding algorithm according to an embodiment of the present invention may have better performance than the existing algorithm.

FIG. 27 is a graph organizing the shortest path distance estimation results of the pathfinding algorithm according to an embodiment of the present invention and an existing software-based landmark algorithm by distance. Here, SGM corresponds to an embodiment of the present invention, and Euclidean and Manhattan correspond to the existing software-based landmark algorithms.

Referring to FIG. 27, in the embodiment of the present invention, while the values measured by distance do not overlap, it is confirmed that in the existing software-based landmark algorithm, the values measured by distance overlapped very seriously. The pathfinding algorithm according to an embodiment of the present invention may perform more accurate distance estimation.

Figure 28:
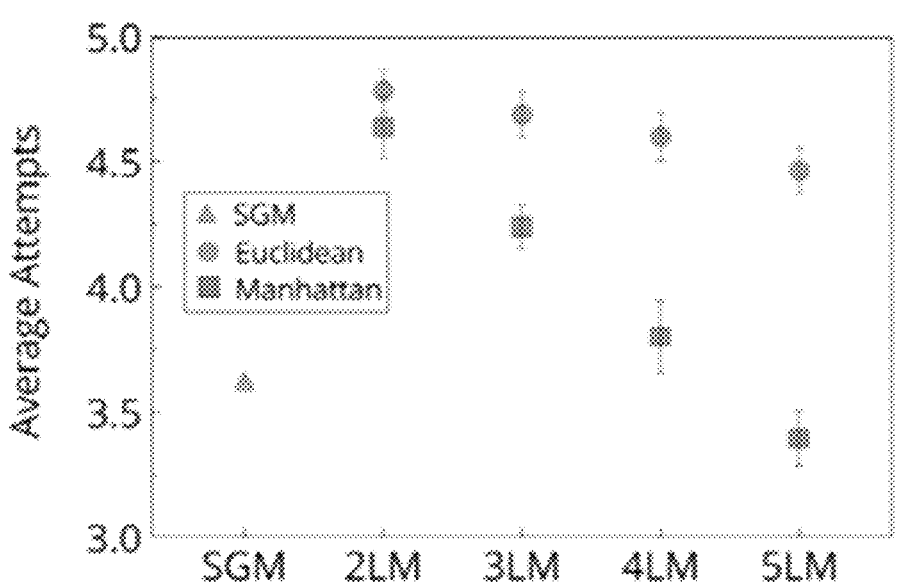
FIG. 28 is a graph showing a comparison of the average number of attempts in the shortest path search using a pathfinding algorithm according to an embodiment of the present invention and an existing software-based landmark (LM) algorithm.

FIG. 28 is a graph showing a comparison of the average number of attempts in the shortest path search using a pathfinding algorithm according to an embodiment of the present invention and an existing software-based landmark (LM) algorithm. Here, SGM corresponds to an embodiment of the present invention, and Euclidean and Manhattan correspond to existing software-based landmark (LM) algorithms. 2LM to 5LM all correspond to existing software-based landmark (LM) algorithms.

Referring to FIG. 28, it may be seen that the pathfinding algorithm according to an embodiment of the present invention may find the shortest path with a smaller number of attempts than the existing software-based landmark (LM) algorithms.

The pathfinding algorithm according to an embodiment of the present invention may be applied to various fields such as, for example, searching for optimal conditions in electronic device or chip design, navigation functions, etc.

The graph data analysis method according to an embodiment of the present invention may include a step for performing a link prediction algorithm, and the step for performing the link prediction algorithm may include a step for performing a multi-ground method (MGM) measurement for a first selected conductor cell (i.e., first selection node) selected from among the plurality of conductor cells, a step for performing a multi-ground method (MGM) measurement for a second selected conductor cell (i.e., a second selection node) selected from among the plurality of conductor cells, and a step for performing a single ground method (SGM) measurements for the first selected conductor cell (i.e., first selection node) and the second selected conductor cell (i.e., second selection node).

Figure 29:
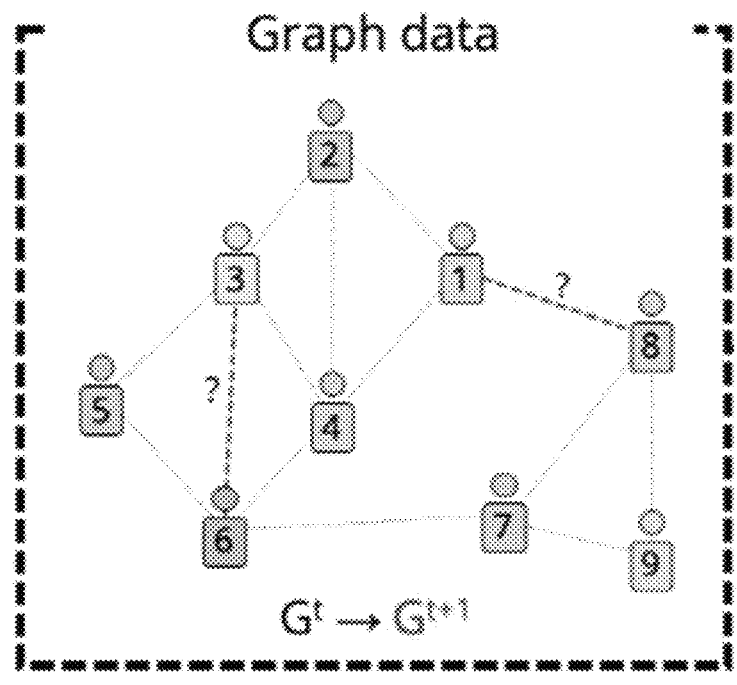
FIG. 29 and FIG. 30 are diagrams for explaining a process for performing a link prediction algorithm in a graph data analysis method using a crossbar array device according to an embodiment of the present invention.
Figure 30:
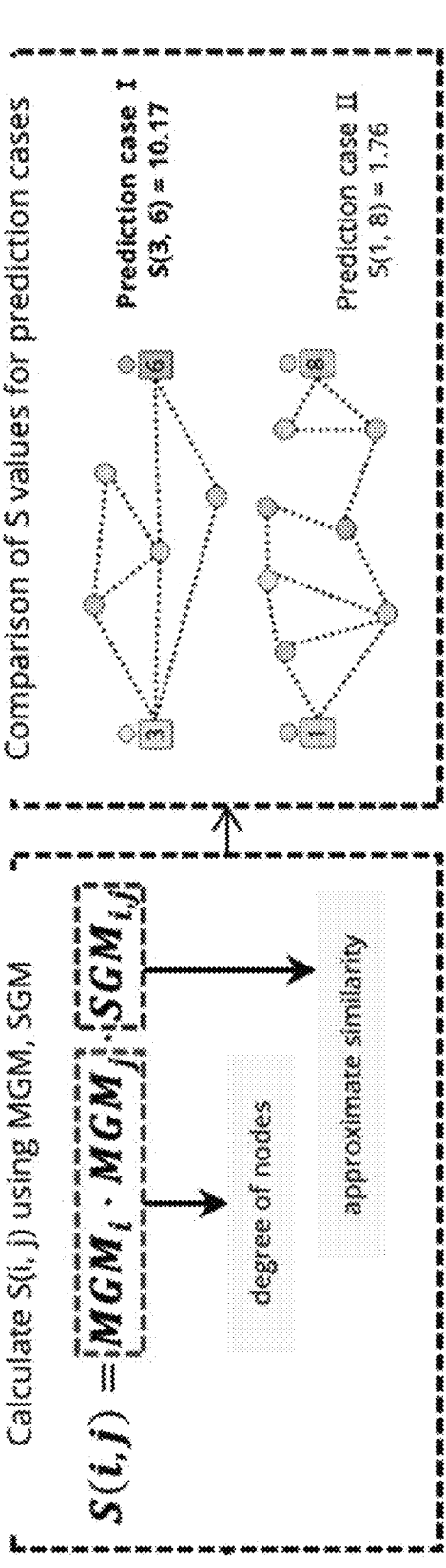

FIG. 29 and FIG. 30 are diagrams for explaining a process for performing a link prediction algorithm in a graph data analysis method using a crossbar array device according to an embodiment of the present invention.

Referring to FIG. 29, in the graph data as described above, the probability that a link will be formed in the future between node 3 and node 6 and the probability that a link will be formed in the future between node 1 and node 8 are may be predicted.

Referring to FIG. 30, in predicting the possibility of a link being formed between node 3 and node 6, MGM-type measurement may be performed for each of node 3 and node 6. That is, MGM₃ measurements and MGM₆ measurements may be performed. As a result, it is possible to check how many adjacent nodes are connected to node 3, and how many adjacent nodes are connected to node 6. In this embodiment, there are three adjacent nodes connected to node 3, and there are also three adjacent nodes connected to node 6. Furthermore, SGM-type measurement may be performed for node 3 and node 6. That is, $SGM_{3,6}$ measurement may be performed. At this time, the measured $SGM_{3,6}$ current value may include all current values which may flow in parallel between the node 3 and the node 6. The SGM measurement current value measured in this example was 1.13 picoamperes. Next, all of the MGM₃ measurement value, MGM₆ measurement value, and $SGM_{3,6}$ measurement current value may be multiplied and an obtained value may be determined as the score (S). Here, the score may be expressed as S(3, 6). In this example, S(3, 6) was 10.17.

In predicting a possibility that a link is formed between node 1 and node 8, the same algorithm as above may be performed, and in this example, S(1, 8) was 1.76.

As a result of comparing the S(3, 6) value and the S(1, 8) value, it may be confirmed that the S(3,6) value is tremendously higher. Based upon this result, it may be predicted that the possibility that a link is formed between node 3 and node 6 is higher than the possibility that a link is formed between node 1 and node 8. As there are many adjacent nodes and many paths connecting them, the possibility of link formation may be higher.

The link prediction algorithm according to an embodiment of the present invention may be very easily performed by using SGM measurement and MGM measurement. When using the algorithm according to the embodiment, sophisticated and highly reliable link prediction may be possible through continuous and integrated measurement and scoring.

Figure 31:
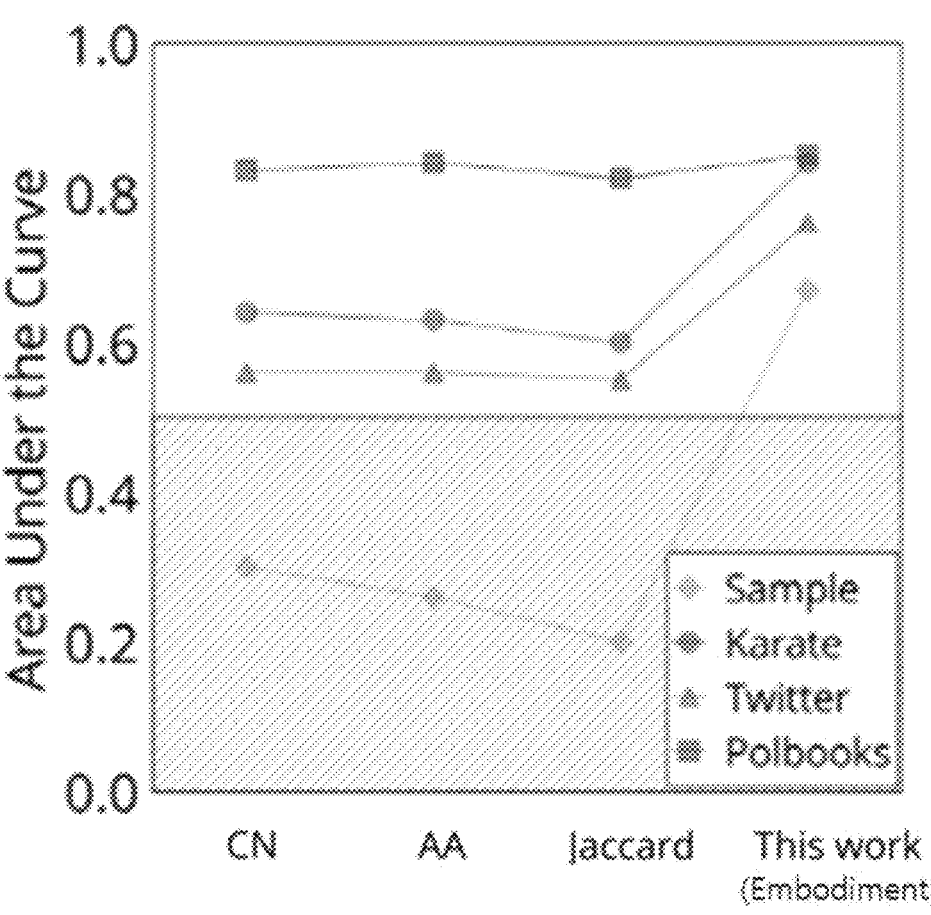
FIG. 31 is a graph showing the results obtained by performing link prediction on several datasets and evaluating the "Area Under Curve (AUC)" characteristics by using an algorithm according to an embodiment of the present invention and existing algorithms.

FIG. 31 is a graph showing the results obtained by performing link prediction on several datasets and evaluating the "Area Under Curve (AUC)" characteristics by using an algorithm according to an embodiment of the present invention and existing algorithms.

Referring to FIG. 31, it may be seen that the algorithm according to an embodiment of the present invention has high performance in link prediction when being compared to existing algorithms.

The link prediction algorithm according to an embodiment of the present invention may be applied to various fields such as, for example, friends recommendation in social networks, protein-protein interaction prediction in new drug development, product recommendation, content recommendation, and advertisement recommendation in e-commerce and OTT (over-the-top) media services, and the like.

The graph data analysis method according to an embodiment of the present invention may include a step for performing a community detection algorithm, and the step for performing a community detection algorithm may include a step for performing single ground method (SGM) measurement respectively on combinations of two conductor cells (i.e., two selection nodes) selected from the plurality of conductor cells (i.e., plural nodes), and a step for evaluating the modularity of the plurality of nodes corresponding to the plurality of conductor cells.

Figure 32:
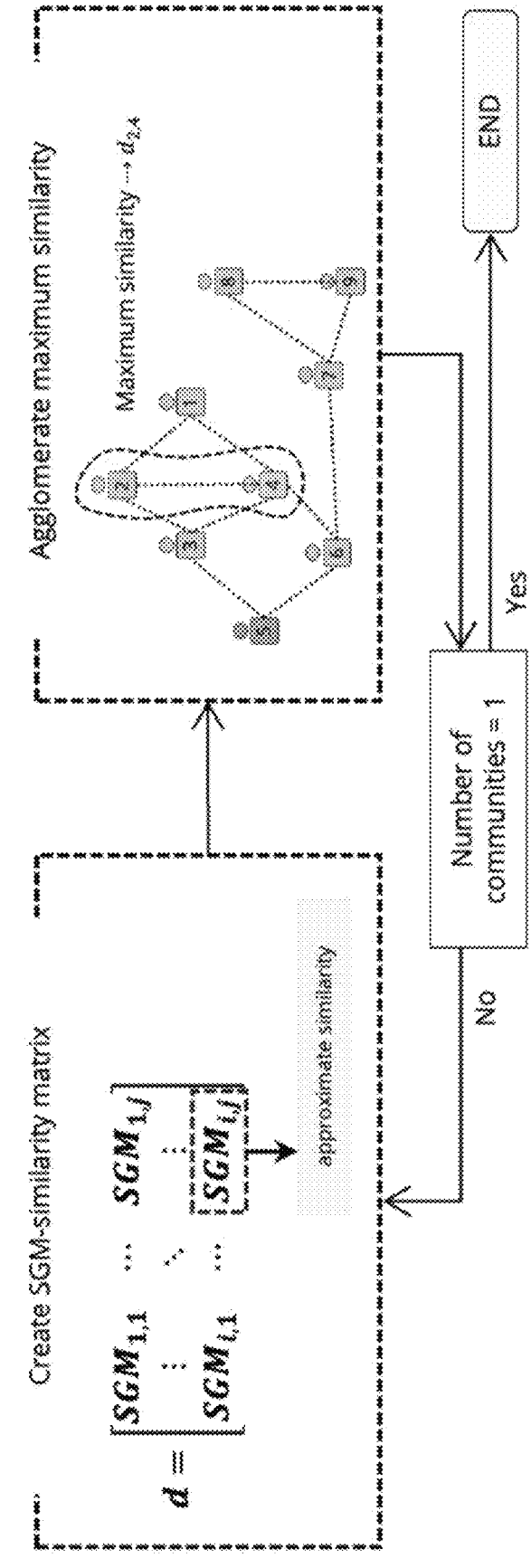
FIG. 32 is a diagram for explaining a process for performing a community detection algorithm in a graph data analysis method using a crossbar array device according to an embodiment of the present invention.

FIG. 32 is a diagram for explaining a process for performing a community detection algorithm in a graph data analysis method using a crossbar array device according to an embodiment of the present invention.

Referring to FIG. 32, in the provided graph data, the SGM-type measurement may be performed for each combination (i.e., pairs) of two nodes selected from a plurality of nodes. All SGM measurement values including $SGM_{1,2}$ measurement value, $SGM_{1,3}$ measurement value, etc. may be obtained. Then, nodes with the highest SGM measurement value between different nodes may be grouped into one community. In this embodiment, the SGM measurement value (i.e., $SGM_{2,4}$ measurement value) between node 2 and node 4 was the highest, and they may be grouped into one community (a seed community). In this way, a process for grouping communities according to an order of highest SGM measurements may be repeated. This process may be repeated until all of the plurality of nodes become one community. In other words, the above grouping process may be repeated until the number of communities reaches 1.

In the process for grouping the communities, modularity (i.e., Q value) may be evaluated at every step. Then, the final community may be calculated by performing a cut-off process at the point where the modularity was highest.

Figure 33:
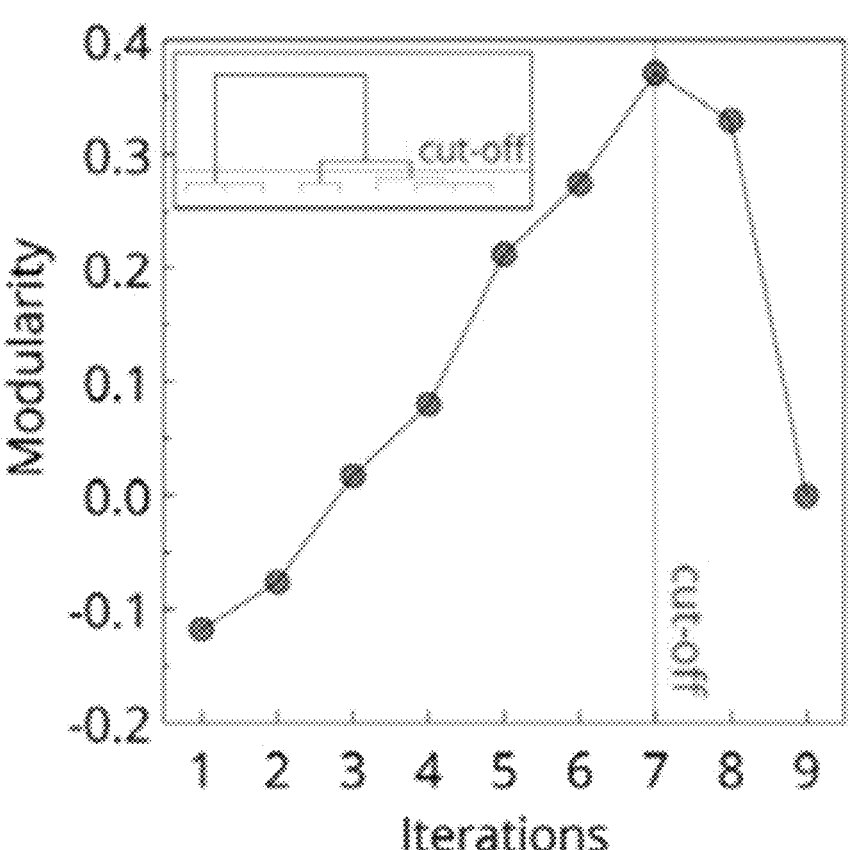
FIG. 33 is a graph showing the modularity (i.e., Q value) measured at each step in the process for grouping communities when performing a community detection algorithm according to an embodiment of the present invention.

FIG. 33 is a graph showing the modularity (i.e., Q value) measured at each step in the process for grouping communities when performing a community detection algorithm according to an embodiment of the present invention.

Referring to FIG. 33, in the process for grouping communities, the modularity was highest at the 7th step, and a cut-off process may be performed at this step.

Figure 34:
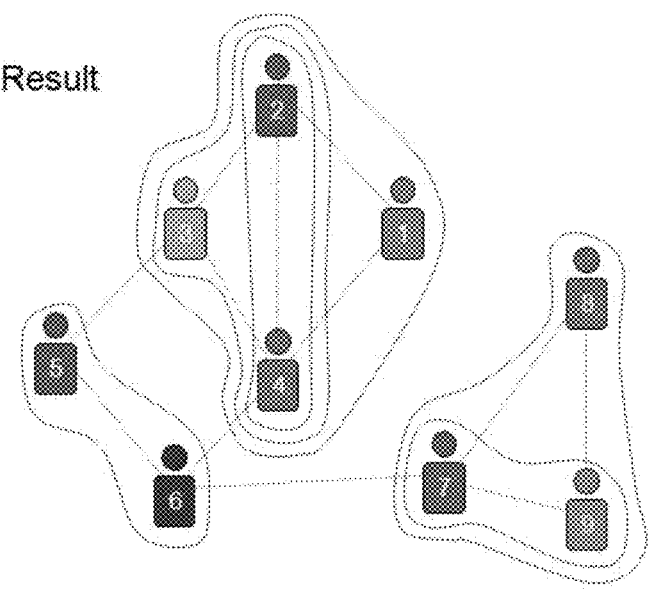
FIG. 34 is a diagram conceptually showing the resulting community calculated by the cut-off process described in FIG. 33.

FIG. 34 is a diagram conceptually showing the resulting community calculated by the cut-off process described in FIG. 33.

Referring to FIG. 34, it may be seen that the nodes are divided into several clusters (communities) depending on the connectivity and distance between nodes.

Figure 35:
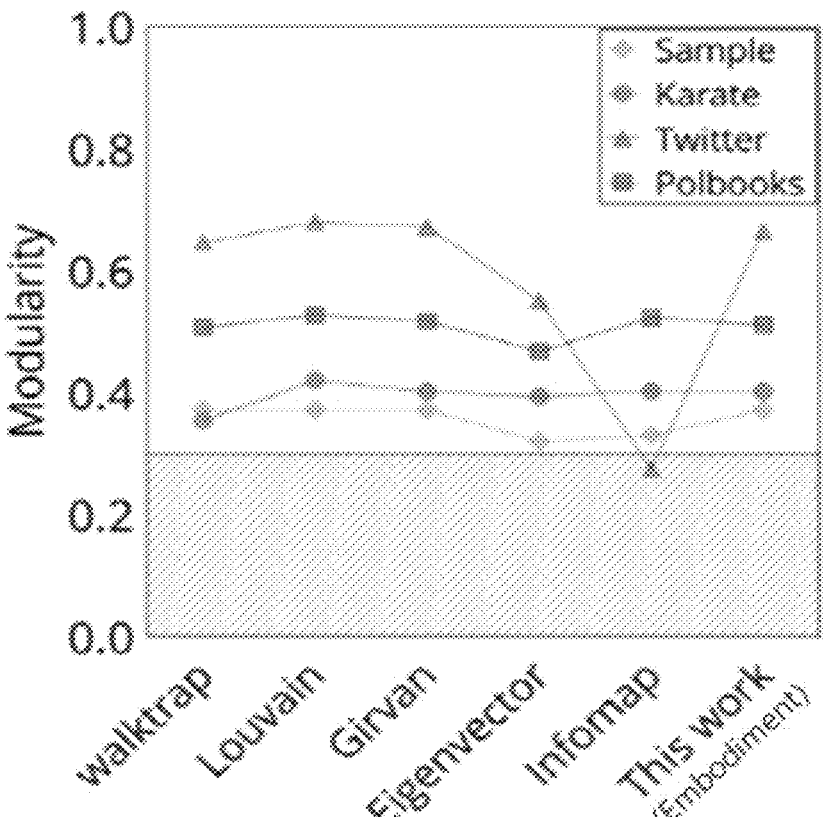
FIG. 35 is a graph showing the results obtained by performing community detection on several datasets and evaluating modularity characteristics using an algorithm according to an embodiment of the present invention and the existing algorithms.

FIG. 35 is a graph showing the results obtained by performing community detection on several datasets and evaluating modularity characteristics using an algorithm according to an embodiment of the present invention and existing algorithms. In general, if the modularity is higher than 0.3, the cluster search is evaluated as successful.

Referring to FIG. 35, it may be seen that the algorithm according to an embodiment of the present invention shows satisfactory performance in community detection when being compared to the existing algorithms.

The graph data applied to the graph data analysis method according to an embodiment of the present invention may include brain network information, and the graph data analysis method may be configured to analyze characteristics related to brain activity. This may be an example that the graph data analysis method according to an embodiment of the present invention being is applied to a real world problem.

Figure 36:
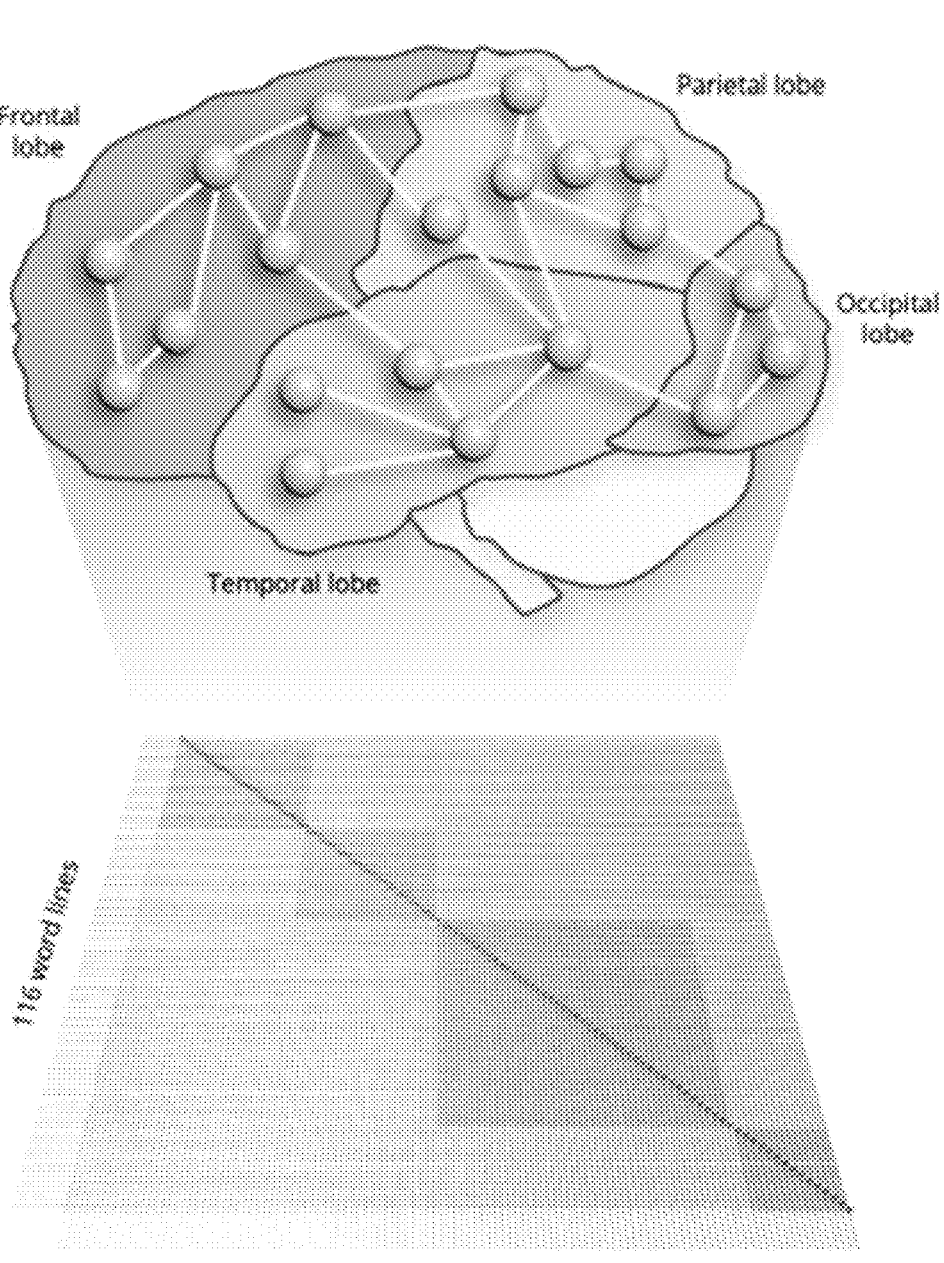
FIG. 36 to FIG. 38 are diagrams for explaining a process for analyzing brain network information by applying a crossbar array device according to an embodiment of the present invention.
Figure 37:
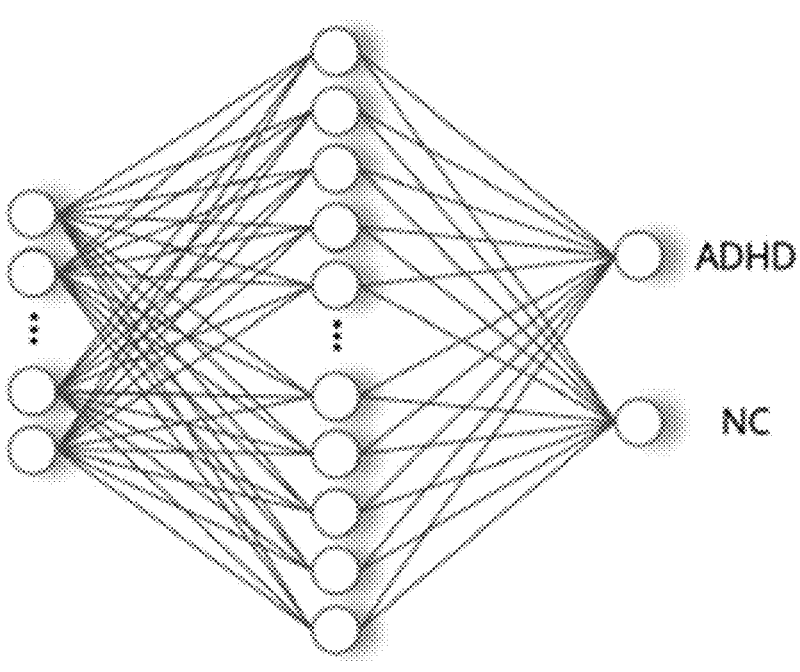
Figure 38:
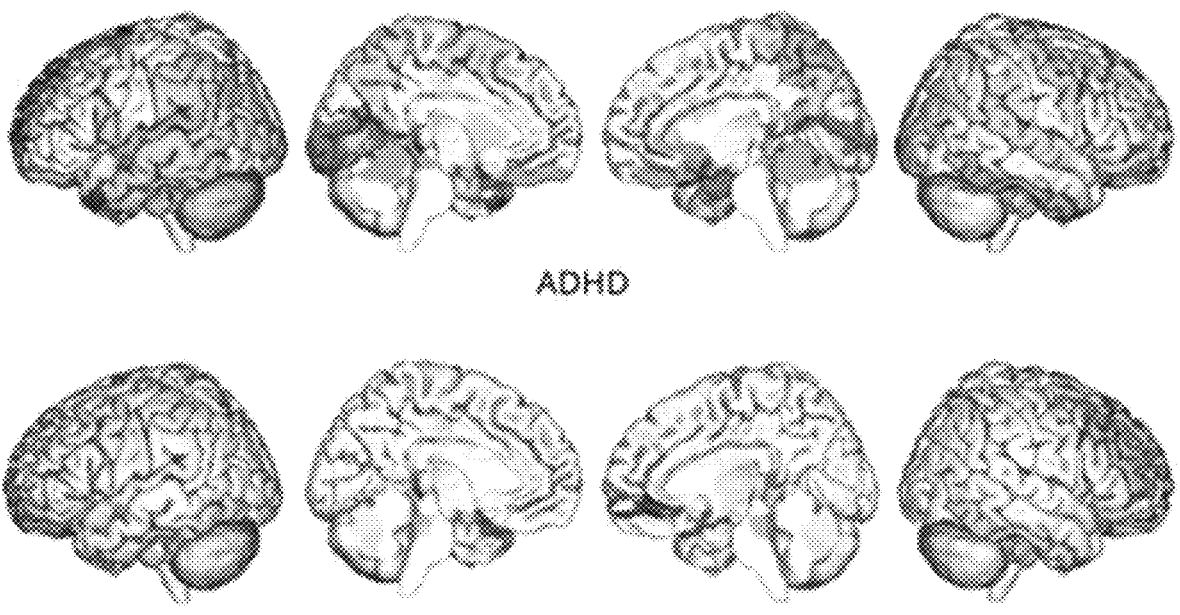

FIG. 36 to FIG. 38 are diagrams for explaining a process for analyzing brain network information by applying a crossbar array device according to an embodiment of the present invention. This embodiment shows a process for classifying attention-deficit hyperactivity disorder (ADHD) by learning the current values obtained from the crossbar array device in an artificial neural network (ANN).

Referring to FIG. 36, the connectivity matrix obtained from the fMRI data was mapped to the crossbar array device according to an embodiment of the present invention by using functional magnetic resonance imaging (fMRI) data as raw data. The connectivity matrix may include a connection data between parcels within the brain. Here, a parcel may correspond to a node. Accordingly, the connectivity matrix may be brain network information, and this information may be mapped to the crossbar array device. Here, the number of nodes was 116, and a crossbar array device including 116 word lines and 116 bit lines was used. SGM measurements between nodes were performed by using the crossbar array device.

Referring to FIG. 37, a learning process was performed by inputting the SGM current values measured in FIG. 36 into an artificial neural network (ANN). Here, NC (neurotypical control) do not mean ADHD, but refers to normal people. In an embodiment of the present invention, a connection with a large difference in SGM current value between ADHD and NC was confirmed, the corresponding node pairs were designated as determinants, and the corresponding SGM measurement values were input into an artificial neural network (ANIN). As a result, ADHD classification may be successfully performed by using the crossbar array device according to an embodiment of the present invention.

Referring to FIG. 38, when the connections which determine ADHD and NC (normal people) are mapped to the brain, the areas with prominent brain activity may appear differently between the two. By finding the best learning combination and mapping it to the brain, it can be revealed that there are areas where there is a noticeable difference in activity in the brains of ADHD and healthy people.

Figure 39:
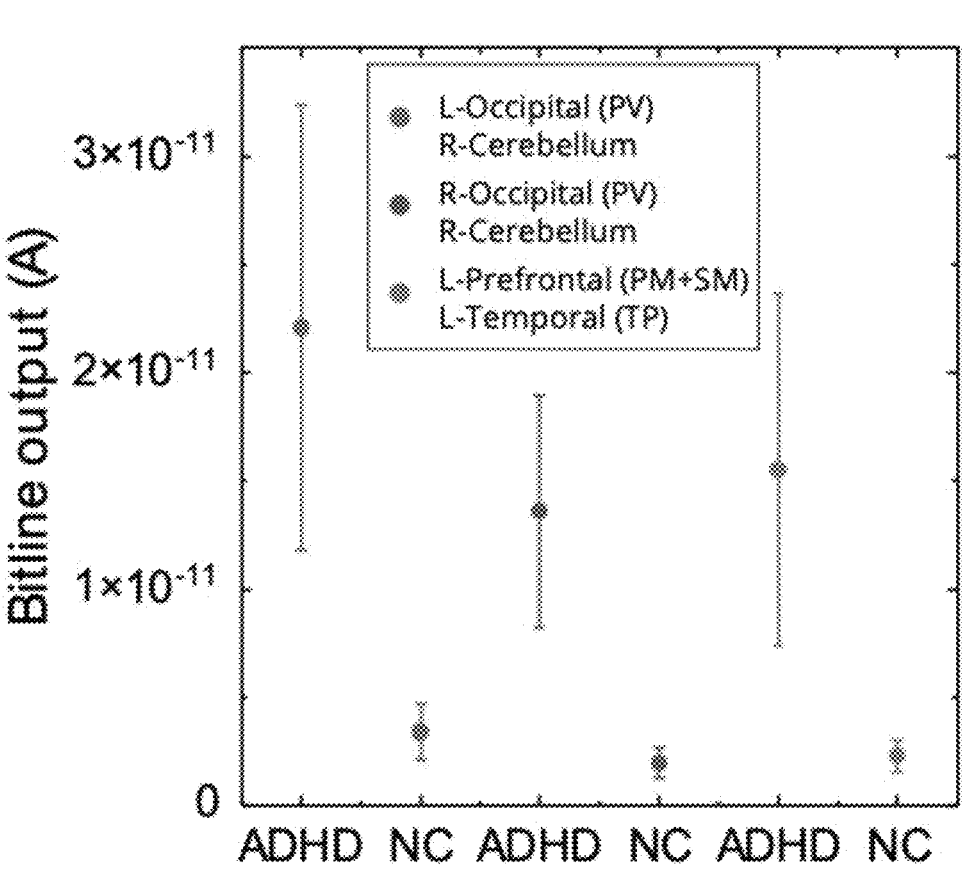
FIG. 39 is a graph showing how SGM current values measured in ADHD and NC (normal people) differ in the process for analyzing brain network information by applying a crossbar array device according to an embodiment of the present invention.

FIG. 39 is a graph showing how SGM current values measured in ADHD and NC (normal people) differ in the process for analyzing brain network information by applying a crossbar array device according to an embodiment of the present invention.

Referring to FIG. 39, with respect to the connections which determine ADHD and NC (normal people), the SGM current value in ADHD was enormously higher than in NC. Therefore, ADHD classification may be easily performed by identifying these determinants.

Figure 40:
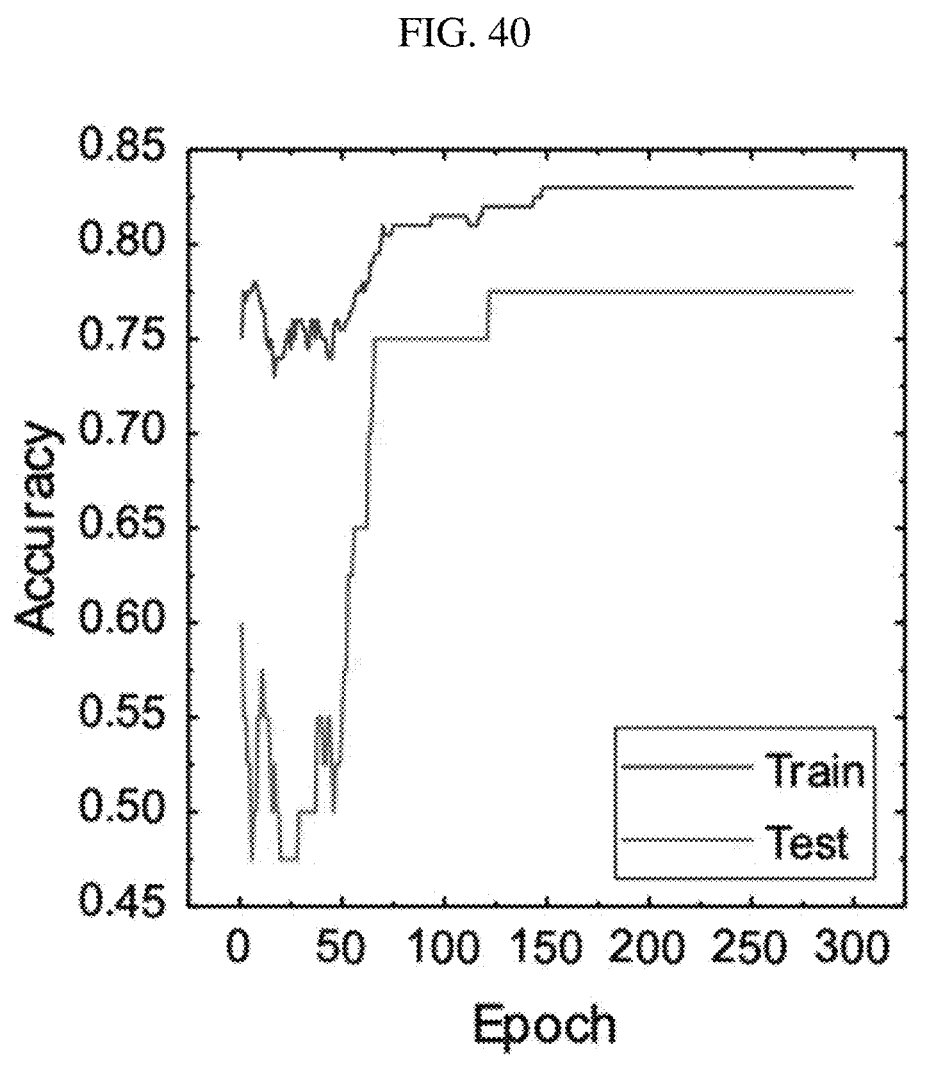

FIG. 40 is a graph showing the results obtained by evaluating accuracy in ADHD classification when a learning process is performed based on SGM measured current values by applying a crossbar array device according to an embodiment of the present invention.

Referring to FIG. 40, when learning was performed based on the SGM measured current value by applying the crossbar array device according to an embodiment of the present invention, a high recognition rate of about 77.5% was shown. Learning was conducted by using the SGM values of multiple n-hop pairs, and learning was not possible by using 1 hop pairs, but learning was performed when 2 hop pairs and 3 hop pairs were added, and when tested, the accuracy was 77.5%. Here, a hop means a one-time connection. In other words, when two nodes are directly connected, it corresponds to 1 hop. 2 hop means that two nodes are connected while one other node is disposed between them, and 3 hop means that two nodes are connected while two other nodes are disposed between them. Two nodes may be indirectly connected rather than directly connected, and a fairly large number of calculations are required to confirm such an indirect connection by using existing algorithms. However, if the crossbar array device according to an embodiment of the present invention is used, an n-hop connection, such as 2 hop or 3 hop, may be confirmed very simply by applying a voltage once between two nodes spaced apart from each other. Therefore, it may be very advantageous in terms of energy and speed/time.

Figure 41:
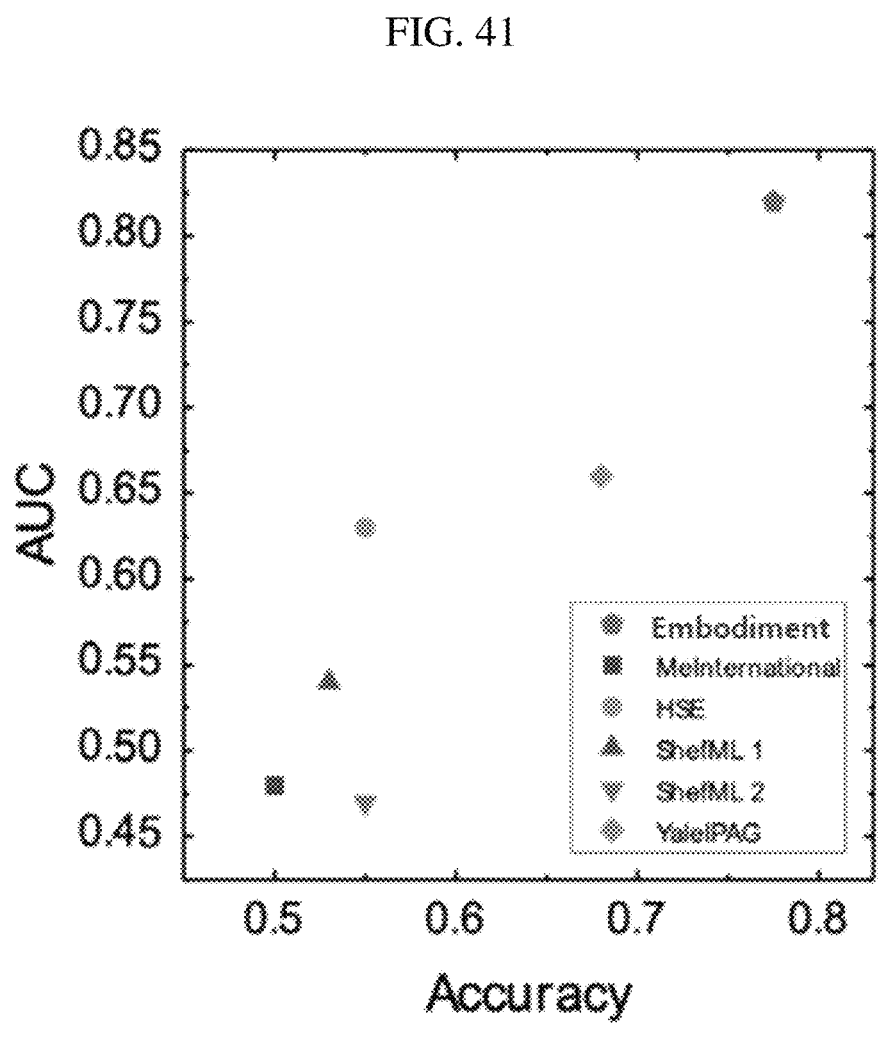

FIG. 41 is a graph showing the results obtained by evaluating accuracy and "Area Under Curve (AUC)" characteristics through learning of ADHD classification using an embodiment of the present invention and existing algorithms.

Referring to FIG. 41, it may be seen that when SGM current-based learning is performed according to an embodiment of the present invention, both of accuracy and AUC characteristics show superior results as compared to existing algorithms.

In the graph data analysis method according to an embodiment of the present invention, memory and processing may be performed by applying a graph data of a non-Euclidean type to a crossbar array device. In this case, preprocessing for a graph data of a non-Euclidean type may not be necessary. In the existing algorithm, it was impossible to calculate similarity by using the non-Euclidean type graph itself. Therefore, conventionally, a process for projecting a graph data of a non-Euclidean type into Euclidean space and preprocessing the data is required. During this preprocessing process, information is lost and the costs are incurred. However, in the crossbar array device according to an embodiment of the present invention, since the current flows in a desired manner to a place with low resistance, the graph data of a non-Euclidean type may be applied without preprocessing.

According to embodiments of the present invention described above, a crossbar array device which may perform analysis on various graph data with low power consumption, high speed, and high accuracy/reliability, and an operation method thereof may be implemented. In addition, according to embodiments of the present invention, a crossbar array device which may provide an analysis solution to graphic problems without preprocessing non-Euclidean type graph data, and an operation method thereof may be implemented. According to embodiments of the present invention, a graph data analysis method using the above-described crossbar array device may be provided. The crossbar array device described above may be usefully used in a neuromorphic device (neuromorphic system) and neural networks.

Most graph data belongs to a non-Euclidean space where location information is not given to nodes, and in order to process non-Euclidean graph data, complex preprocessing processes such as graph embedding, which projects graph data into Euclidean space, are required. The new crossbar array device proposed in an embodiment of the present invention may store non-Euclidean type graph data and simultaneously analyze it without a separate preprocessing process. Saving and analyzing a graph data as it is not only tremendously reduces computational costs, but also avoids problems such as data loss which occurs during preprocessing.

In addition, a graph data may change depending on the situation, and the existing method has a limitation that it is vulnerable to dynamic data processing because data preprocessing must be performed every time the data changes. However, the new crossbar array device proposed in the embodiment of the present invention has the advantage that it may be more advantageous in situations where a graph data changes and grows in a real time because it is able to freely change data, such as adding a new node or changing edge information.

In addition, embodiments of the present invention may be universally used in fields expressed in graph structures. Main diagonal-shortened CBA (i.e., mCBA)-based path-finding algorithm may be used in a chip design such as a floor planning of semiconductor chips. Meanwhile, mCBA's leakage current-based similarity may be applied to protein-protein interaction prediction and drug discovery. Similarity based on leakage current may be applied to cluster search and may also be used to analyze the spread of infectious diseases. In addition, the embodiments of the present invention may be applicable to various fields.

Meanwhile, in connection with theoretical research, mathematical calculation equations, and related data which are applied to a crossbar array device applicable to graph data analysis according to an embodiment of the present invention, a neuromorphic device including the crossbar array device, an operation method of the crossbar array device, and a graph data analysis method using the crossbar array device, the disclosure of "Graph Analysis with Multifunctional Self-Rectifying Memristive Crossbar Array, Advanced Materials, 2022," a paper published by the inventor of the present application may be referred to, and the disclosure of this paper may be entirely incorporated herein as a reference of the specification.

In this specification, the preferred embodiments of the present invention have been disclosed, and although specific terms have been used, they are only used in a general sense to easily explain the technological content of the present invention and to help understanding the present invention, and they are not used to limit the scope of the present invention. It is obvious to those having ordinary skill in the related art to which the present invention belong that other modifications based on the technological idea of the present invention may be implemented in addition to the embodiments disclosed herein. It will be understood to those having ordinary skill in the related art that in connection with a crossbar array device applicable to graph data analysis, a neuromorphic device including the same, an operation method of the crossbar array device, and a graph data analysis method using the crossbar array device according to the embodiment described with reference to FIGS. 1 to 41, various substitutions, changes, and modifications may be made without departing from the technological spirit of the present invention. Therefore, the scope of the invention should not be determined by the described embodiments, but should be determined by the technological concepts described in the claims.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A crossbar array device applicable to graph data analysis, comprising:
   a plurality of word lines extending in a first direction;
   a plurality of bit lines extending in a second direction intersecting the plurality of word lines;
   a plurality of conductor cells disposed in intersection regions corresponding to a diagonal among a plurality of intersection regions defined between the plurality of word lines and the plurality of bit lines; and
   a plurality of rectifying resistance change cells disposed in remaining intersection regions excluding the diagonal among the plurality of intersection regions, having a rectifying characteristic and storing a changeable resistance state.

2. The crossbar array device of claim 1, wherein the plurality of conductor cells are disposed in intersection regions corresponding to a main diagonal in the plurality of intersection regions.

3. The crossbar array device of claim 1, wherein the plurality of conductor cells are a metal cell.

4. The crossbar array device of claim 1, wherein the plurality of rectifying resistance change cells are a self-rectifying memristor.

5. The crossbar array device of claim 1, wherein the plurality of rectifying resistance change cells are configured to be programmed according to a graph data to be analyzed.

6. The crossbar array device of claim 1,
   wherein the graph data to be analyzed by the crossbar array device includes a plurality of nodes and a plurality of edges connecting the plurality of nodes,
   wherein information corresponding to the plurality of nodes is mapped to the plurality of conductor cells,
   wherein information corresponding to the plurality of edges is mapped to the plurality of rectifying resistance change cells.

7. The crossbar array device of claim 1, wherein a number of the plurality of word lines and a number of the plurality of bit lines are same.

8. A neuromorphic device comprising the crossbar array device according to any one of claim 1.

9. A graph data analysis method using a crossbar array device, comprising:

preparing a crossbar array device comprising a plurality of word lines extending in a first direction, a plurality of bit lines extending in a second direction intersecting the plurality of word lines, a plurality of conductor cells disposed in intersection regions corresponding to a diagonal among a plurality of intersection regions defined between the plurality of word lines and the plurality of bit lines, and a plurality of rectifying resistance change cells disposed in remaining intersection regions excluding the diagonal among the plurality of intersection regions, and having a rectifying characteristic and storing a changeable resistance state;

mapping graph data to be analyzed to the crossbar array device; and performing measurement on the crossbar array device to which the graph data is mapped.

10. The graph data analysis method of claim 9, wherein the plurality of conductor cells are in intersection regions corresponding to a main diagonal in the plurality of intersection regions.

11. The graph data analysis method of claim 9, wherein the plurality of rectifying resistance change cells are a self-rectifying memristor.

12. The graph data analysis method of claim 9, wherein the graph data includes a plurality of nodes and a plurality of edges connecting the plurality of nodes, wherein in the mapping graph data, information corresponding to the plurality of nodes is mapped to the plurality of conductor cells, and information corresponding to the plurality of edges is mapped to the plurality of rectifying resistance change cells.

13. The graph data analysis method of claim 9, wherein the performing measurement on the crossbar array device includes performing a single ground method (SGM) measurement applying a read signal to one word line selected from among the plurality of word lines and applying a ground signal to one bit line selected from the plurality of bit lines.

14. The graph data analysis method of claim 9, wherein the performing measurement on the crossbar array device includes performing a multi-ground method (MGM) measurement applying a read signal to one word line connected to a conductor cell selected from the plurality of conductor cells among the plurality of word lines, and applying a ground signal to at least two of remaining bit lines excluding a bit line connected to the selected conductor cell among the plurality of bit lines.

15. The graph data analysis method of claim 9, further comprising performing a pathfinding algorithm, wherein, in the performing the pathfinding algorithm, performing a multi-ground method (MGM) measurement and performing a single-ground method (SGM) measurement are alternately repeated, wherein the performing the multi-ground method (MGM) measurement is configured to apply a read signal to one word line connected to a conductor cell selected from the plurality of conductor cells among the plurality of word lines and to apply a ground signal to at least two of remaining bit lines excluding a bit line connected to the selected conductor cell from the plurality of bit lines, wherein the performing the single ground method (SGM) measurement is configured to apply a read signal to one word line selected from among the plurality of word lines and to apply a ground signal to one bit line selected from the plurality of bit lines.

16. The graph data analysis method of claim 9, further comprising performing a link prediction algorithm, wherein the performing the link prediction algorithm includes:

performing a multi-ground method (MGM) measurement for a first conductor cell selected from among the plurality of conductor cells;

performing a multi-ground method (MGM) measurement for a second conductor cell selected from among the plurality of conductor cells; and performing a single ground method (SGM) measurement on the first selected conductor cell and the second selected conductor cell, wherein the performing the multi-ground method (MGM) measurement is configured to apply a read signal to one word line connected to a conductor cell selected from the plurality of conductor cells among the plurality of word lines, and to apply a ground signal to at least two of remaining bit lines excluding a bit line connected to the selected conductor cell among the plurality of bit lines, wherein the performing the single ground method (SGM) measurement is configured to apply a read signal to one word line selected among the plurality of word lines and to apply a ground signal to one bit line selected among the plurality of bit lines.

17. The graph data analysis method of claim 9, further comprising performing a community detection algorithm, wherein the performing the community detection algorithm includes:

performing a single ground measurement (SGM) measurement for each of combinations of two conductor cells selected from the plurality of conductor cells; and evaluating modularity of a plurality of nodes corresponding to the plurality of conductor cells, wherein the performing the single ground method (SGM) measurement is configured to apply a read signal to one word line selected among the plurality of word lines and to apply a ground signal to one bit line selected among the plurality of bit lines.

18. The graph data analysis method of claim 9, wherein the graph data is a data including brain network information, and the graph data analysis method is configured to analyze a feature related to brain activity.

19. The graph data analysis method of claim 9, wherein the graph data is a non-Euclidean type graph data.

* * * * *